US010027358B2

(12) United States Patent
Wu et al.

(10) Patent No.: US 10,027,358 B2
(45) Date of Patent: Jul. 17, 2018

(54) HARMONIC SELECTIVE FULL-BAND CAPTURE RECEIVER WITH DIGITAL HARMONIC REJECTION CALIBRATION

(71) Applicant: AVAGO TECHNOLOGIES GENERAL IP (SINGAPORE) PTE. LTD., Singapore (SG)

(72) Inventors: Hao Wu, Los Angeles, CA (US); David Patrick Murphy, Costa Mesa, CA (US); Hooman Darabi, Laguna Niguel, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 13 days.

(21) Appl. No.: 15/240,344

(22) Filed: Aug. 18, 2016

(65) Prior Publication Data

US 2018/0048339 A1    Feb. 15, 2018

Related U.S. Application Data

(60) Provisional application No. 62/375,188, filed on Aug. 15, 2016.

(51) Int. Cl.
*H03D 1/04* (2006.01)
*H03D 1/06* (2006.01)
(Continued)

(52) U.S. Cl.
CPC .......... *H04B 1/109* (2013.01); *H03D 7/1466* (2013.01); *H04B 1/1018* (2013.01);
(Continued)

(58) Field of Classification Search
CPC .......... H04B 10/6933; H04B 10/695; H04B 1/1027; H04B 1/123; H04B 1/1036;
(Continued)

(56) References Cited

U.S. PATENT DOCUMENTS 7,139,544 B2 * 11/2006 Smith .................. H04B 1/30
455/307
7,570,936 B2 * 8/2009 Vice ..................... H03D 7/125
327/355

(Continued)

OTHER PUBLICATIONS

David Murphy, et al., "A Noise-Cancelling Receiver with Enhanced Resilience to Harmonic Blockers", IEEE International Solid-State Circuits Conference, ISSCC, Digest of Technical Papers, Session 3, Feb. 10, 2014, pp. 68-70.

(Continued)

*Primary Examiner* — James M Perez
(74) *Attorney, Agent, or Firm* — Oblon, McClelland, Maier & Neustadt, L.L.P.

(57) ABSTRACT

A receiver includes circuitry configured to determine one or more first local oscillator (LO) harmonics that correspond to one or more first spectrum segments of a down-converted received signal based on characteristics of the received signal. The one or more first LO harmonics of the received signal are amplified by applying one or more first transconductance coefficients to one or more first harmonic selective transinductance amplifiers (TIAs) corresponding to the one or more first spectrum segments. Digitized outputs of the plurality of harmonic selective TIAs are calibrated based on an amount of signal leakage between the plurality of spectrum segments of the down-converted received signal.

19 Claims, 12 Drawing Sheets

(51) Int. Cl.

| | | |
|---|---|---|
| *H03K 5/01* | (2006.01) | |
| *H03K 6/04* | (2006.01) | |
| *H04B 1/10* | (2006.01) | |
| *H04L 1/00* | (2006.01) | |
| *H04L 25/08* | (2006.01) | |
| *H03D 7/14* | (2006.01) | |
| *H04W 4/00* | (2018.01) | |
| *H04W 4/80* | (2018.01) | |

(52) U.S. Cl.
CPC .......... *H04B 1/1036* (2013.01); *H04W 4/008* (2013.01); *H04W 4/80* (2018.02)

(58) Field of Classification Search
CPC ... H04L 25/061; H04L 25/062; H04L 25/063; H04L 27/2647; H04L 1/20
USPC .................................................. 375/316–352
See application file for complete search history.

(56) References Cited

U.S. PATENT DOCUMENTS

| | | | | |
|---|---|---|---|---|
| 8,081,937 B2* | 12/2011 | Mirzaei | ............... | H03D 7/1441 327/355 |
| 8,275,332 B2* | 9/2012 | Mirzaei | ............... | H03D 7/1441 327/355 |
| 8,761,710 B2* | 6/2014 | Rofougaran | ......... | H03D 7/1441 375/343 |
| 8,798,216 B2* | 8/2014 | Pullela | ................... | H03D 7/165 375/318 |
| 9,014,653 B2* | 4/2015 | Madadi | .................... | H03B 1/00 375/319 |
| 9,083,311 B2* | 7/2015 | Kim | ......................... | H03H 9/70 |
| 9,088,471 B1* | 7/2015 | Kim | ...................... | H04L 27/362 |
| 9,124,335 B1* | 9/2015 | Murphy | ................. | H04B 15/06 |
| 9,219,507 B2* | 12/2015 | Rofougaran | ......... | H04B 1/1036 |
| 9,246,719 B2* | 1/2016 | Pullela | ................... | H03D 7/165 |
| 9,595,985 B1* | 3/2017 | Murphy | ................... | H04B 1/10 |
| 9,729,119 B1* | 8/2017 | Blatz | .................... | H03G 3/3036 |
| 2005/0239430 A1* | 10/2005 | Shah | ....................... | H03D 7/14 455/326 |
| 2006/0293017 A1* | 12/2006 | Kim | ...................... | H03D 7/1433 455/323 |
| 2008/0284487 A1* | 11/2008 | Pullela | ................ | H03D 7/1441 327/355 |
| 2009/0143031 A1* | 6/2009 | Shah | ....................... | H03D 7/14 455/114.1 |
| 2010/0019848 A1* | 1/2010 | Rossi | ..................... | H03F 1/223 330/253 |
| 2011/0222633 A1* | 9/2011 | Pullela | .................. | H03D 7/165 375/318 |
| 2012/0071119 A1* | 3/2012 | Mirzaei | ................ | H03D 7/1441 455/127.2 |
| 2013/0169378 A1* | 7/2013 | Kim | ......................... | H03H 7/46 333/126 |
| 2014/0112418 A1* | 4/2014 | Jung | ........................ | H04B 1/18 375/340 |
| 2015/0063509 A1* | 3/2015 | Hedayati | .............. | H04B 15/005 375/350 |
| 2015/0304155 A1* | 10/2015 | Lin | .................... | H03H 11/1213 375/345 |
| 2016/0142085 A1* | 5/2016 | Choksi | ................ | H04B 1/1018 375/340 |
| 2018/0048339 A1* | 2/2018 | Wu | ........................ | H04B 1/109 |

OTHER PUBLICATIONS

Jiangfeng Wu, et al., "A 2.7 mW/Channel 48/1000 MHz Direct Sampling Full-Band Cable Receiver", IEEE Journal of Solid-State Circuits, vol. 51, No. 4, Apr. 2016, pp. 845-859.

David Murphy, et al., "A Blocker-Tolerant, Noise-Cancelling Receiver Suitable for Wideband Wireless Applications", IEEE Journal of Solid-State Circuits, vol. 47, No. 12, Dec. 2012, pp. 2943-2963.

\* cited by examiner

HARMONIC SELECTIVE FULL-BAND CAPTURE RECEIVER WITH DIGITAL HARMONIC REJECTION CALIBRATION

CROSS-REFERENCE TO RELATED PATENT APPLICATIONS

The present application claims the benefit of the earlier filing date of U.S. provisional application 62/375,188 having common inventorship with the present application and filed in the U.S. Patent and Trademark Office on Aug. 15, 2016, the entire contents of which being incorporated herein by reference.

TECHNICAL FIELD

The present disclosure is directed to radio frequency (RF) receivers and more specifically to RF receiver front ends.

BACKGROUND

Wideband receivers are configured to provide filtering to most out-of-band blocker signals before any baseband amplification. Wideband receivers can employ passive mixers that immediately down-convert an input current to baseband. A transimpedance amplifier (TIA) then converts any baseband current in the receive band to voltage. A received radio frequency (RF) signal may include an unwanted blocker signal at frequency $f_b$, and a wanted signal at frequency $f_w$, which may be $\Delta f_b$ greater than $f_b$, e.g., $f_w = f_b + \Delta f_b$. However, these unwanted blocker signals experience some amplification around the RF band. This unnecessary amplification of unwanted blocker signals has potential to saturate the receiver, thus resulting in degradation of performance.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
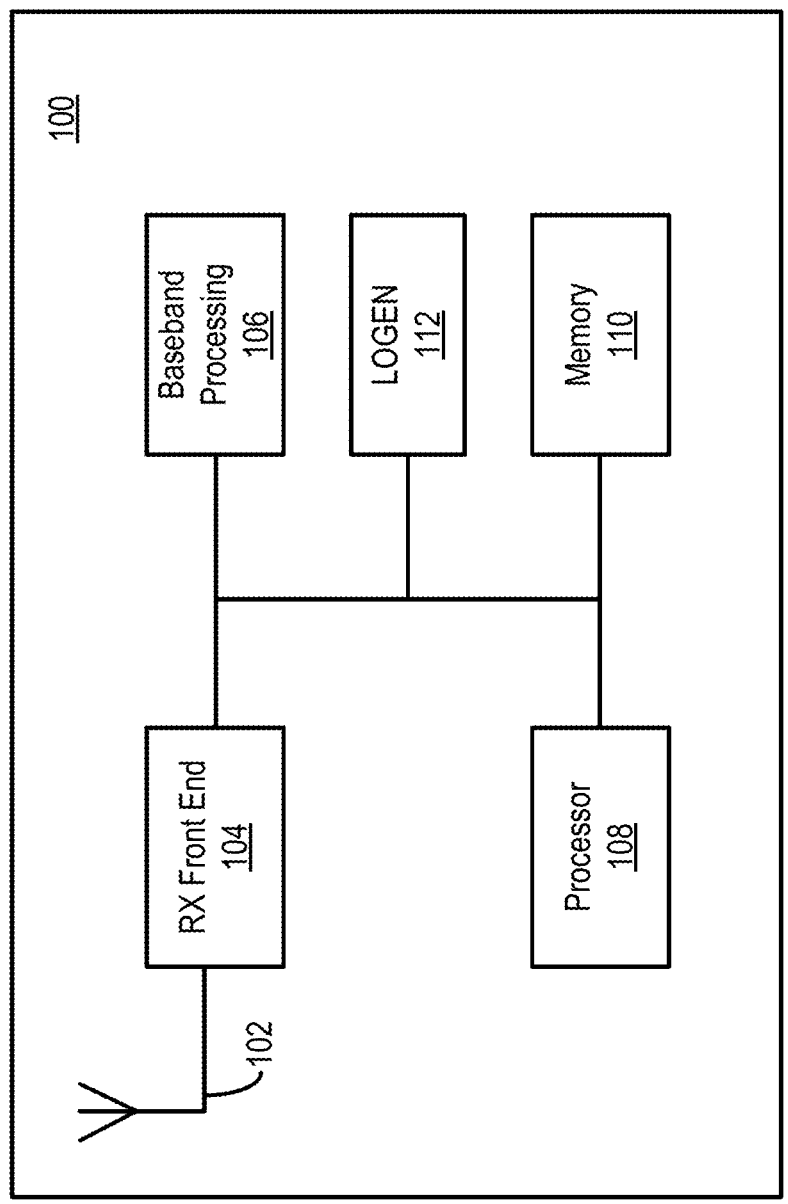
FIG. 1 is a block diagram of an exemplary wireless communication device.

In the drawings, like reference numerals designate identical or corresponding parts throughout the several views. Further, as used herein, the words "a," "an" and the like generally carry a meaning of "one or more," unless stated otherwise.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

In an exemplary implementation, a device includes circuitry configured to determine one or more first local oscillator (LO) harmonics that correspond to one or more first spectrum segments of a down-converted received signal based on characteristics of the received signal. The one or more first LO harmonics of the received signal are amplified by applying one or more first transconductance coefficients to one or more first harmonic selective transinductance amplifiers (TIAs) corresponding to the one or more first spectrum segments. Digitized outputs of the plurality of harmonic selective TIAs are calibrated based on an amount of signal leakage between the plurality of spectrum segments of the down-converted received signal.

In another exemplary implementation, a process includes tuning, at a device with circuitry, a first local oscillator (LO) of a plurality of non-overlapping LOs of a receiver to a fundamental frequency based on at least one frequency band of a received signal; converting, via the circuitry, the received signal via the plurality of non-overlapping LOs into one or more spectrum segments that correspond to one or more harmonics of the fundamental frequency; amplifying, via the circuitry, one or more first spectrum segments of the one or more spectrum segments that correspond to the at least one frequency band of the received signal; and calibrating, via the circuitry, one or more digitized spectrum segments based on an amount of signal leakage between the one or more spectrum segments of the down-converted received signal.

In another exemplary implementation, a receiver includes circuitry configured to tune a first local oscillator (LO) of a plurality of non-overlapping LOs of a receiver to a fundamental frequency based on at least one frequency band of a received signal, convert the received signal via the plurality of non-overlapping LOs into one or more spectrum segments that correspond to one or more harmonics of the fundamental frequency, and amplify one or more first spectrum segments of the one or more spectrum segments that correspond to the at least one frequency band of the received signal.

Aspects of the present disclosure are directed to a harmonic selective full-band capture (FBC) receiver in an electronic device that employs a multi-phase non-overlapping local oscillator (LO) and selectively receives one or more spectrum segments associated with LO harmonics based on properties of received signals and interferers (e.g., blockers). In some implementations, the receiver is a mixer-first receiver that uses noise-cancellation and harmonic selective transimpedance amplifiers (TIAs) to achieve high linearity and low noise. The receiver can receive multiple wireless signals over a large frequency range from 800 MHz to 2.5 GHz with a 2-4 dB noise figure (NF) that can tolerate up to −10 dBm out-of-band blockers. The receiver also performs digital harmonic rejection calibration to reduce the effects of phase and amplitude mismatches in the LO down-conversion. Because the harmonic selective FBC receiver processes a subset of the received LO channels and provides filtering to blockers prior to digitization, the analog-to-digital converters (ADCs) can have a smaller dynamic range than ADCs associated with a direct sampling (DS) FBC receiver, which can provide significant power savings.

FIG. 1 illustrates a block diagram of a wireless communication device 100 in which the subject technology may be used in accordance with one or more implementations. Referring to FIG. 1, the wireless communication device 100 includes an antenna 102, a receiver front end 104, a baseband processing module 106, a processor 108, a memory 110, and a LO generation module (LOGEN) 112. The blocks represented in FIG. 1 may be integrated on semiconductor substrates. For example, the blocks 104-112 may be realized in a single system-on-chip, or realized in a multi-chip chipset.

The antenna 102 is configured to transmit and/or receive wireless signals over a range of frequencies. Although a single antenna is illustrated, the subject disclosure is not so limited. The receiver front end 104 includes logic, circuitry and/or interfaces that are configured to receive and process signals from the antenna 102. The receiver front end 104, for example, may be configured to amplify and/or down-covert received wireless signals. The receiver front end 104 also may be configured to cancel noise arising from impedance matching and may be linear over a wide range of frequencies. In this regard, the receiver front end 104 may receive signals in accordance with a variety of wireless standards. The receiver front end 104 may be applicable to standards, including but not limited to, Wi-Fi, WiMAX, Bluetooth, and various cellular standards. Details regarding the receiver front end 104 are discussed further herein.

The baseband processing module 106 includes logic, circuitry and/or interfaces that are configured to perform processing of baseband signals. The baseband processing module 106 may, for example, analyze received signals and generate control and/or feedback signals for configuring various components of the wireless communication device 100 such as the receiver front end 104. The baseband processing module 106 is configured to encode, decode, transcode, modulate, demodulate, encrypt, decrypt, scramble, descramble, and/or otherwise process data in accordance with wireless standards. In some implementations, the baseband processing module 106 may be configured to determine frequency bands associated with desired received signals as well as frequency bands associated with blockers, determine conductance gain coefficients for down-converted spectrum segments that correspond to the desired received signals, and determine calibration coefficients for the one or more digitized spectrum segments based on an amount of interference between the LO harmonics. Details regarding the processes performed by the baseband processing module 106 are discussed further herein.

The processor 108 includes logic, circuitry and/or interfaces that are configured to process data and/or control operations of the wireless communication device 100. In this regard, the processor 108 is configured to provide control signals to various other portions of the wireless communication device 100. The processor 108 may control transfers of data between various portions of the wireless communication device 100. Additionally, the processor 108 may provide for implementation of an operating system or otherwise execute code to manage operations of the wireless communication device 100. In some implementations, the processes performed by the baseband processing module 106 and the processor 108 can be performed by a single processing device, or processes performed by the baseband processing module 106 can also be performed by the processor 108. Therefore, references to the baseband processing module 106 and the processor 108 throughout the disclosure can be used interchangeably.

The memory 110 includes logic, circuitry and/or interfaces for storage of various types of information such as received data, generated data, code, and/or configuration information. The memory 110 may include a non-transitory storage medium, including but not limited to, RAM, ROM, flash, and/or magnetic storage. According to some implementations of the subject disclosure, information stored in the memory 110 is utilized for configuring the receiver front end 104 and/or the baseband processing module 106.

The LOGEN 112 includes logic, circuitry and/or interfaces that are configured to generate oscillating signals at multiple frequencies. The LOGEN 112 may be configured to generate digital and/or analog signals. In this regard, the LOGEN 112 is configured to generate clock signals and/or sinusoidal signals. Characteristics of the oscillating signals such as the frequency and duty cycle may be determined based on control signals from the processor 108 and/or the baseband processing module 106.

In some implementations, the processor 108 configures the various components of the wireless communication device 100 based on a wireless standard according to which it is desired to receive signals. Wireless signals are received via the antenna 102, amplified and down-converted by the receiver front end 104. The baseband processing module 106 may perform noise estimation and/or noise cancellation, decoding, and/or demodulation of the baseband signals. In this regard, information in the received signal is recovered and utilized appropriately. For example, the information may be audio and/or video to be presented to a user of the wireless communication device 100, data to be stored to the memory 110, and/or information affecting and/or enabling operation of the wireless communication device 100.

Figure 2A:
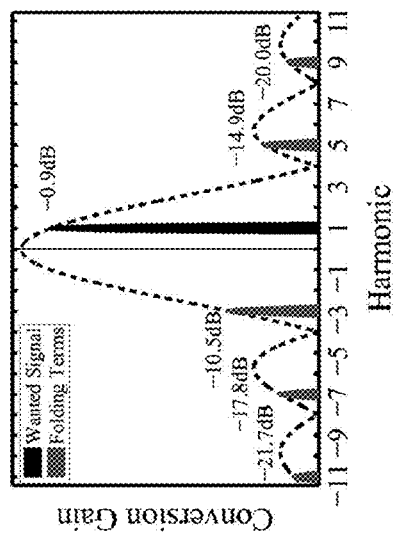
FIG. 2A illustrates exemplary graphs of local oscillator (LO) signal and gain waveforms for a mixer.
Figure 2A:
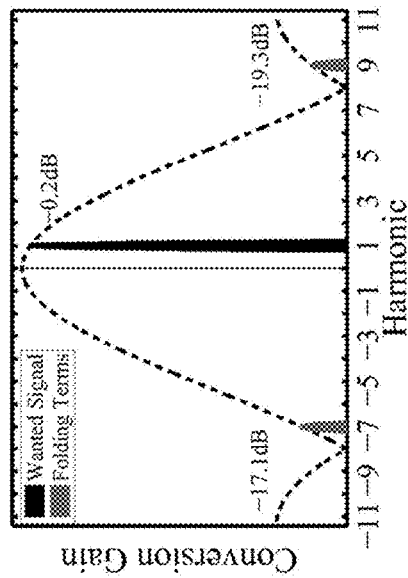
Figure 2B:
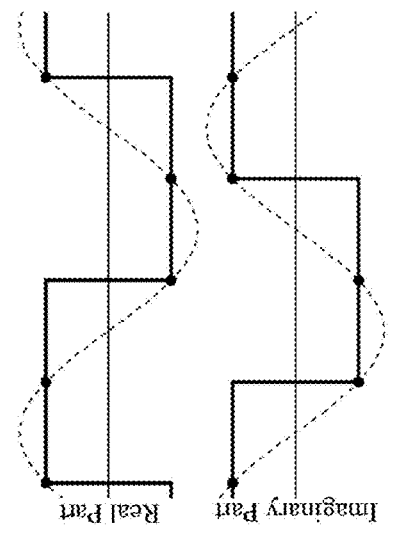
FIG. 2B illustrates exemplary graphs LO signal and gain waveforms for a mixer.
Figure 2B:
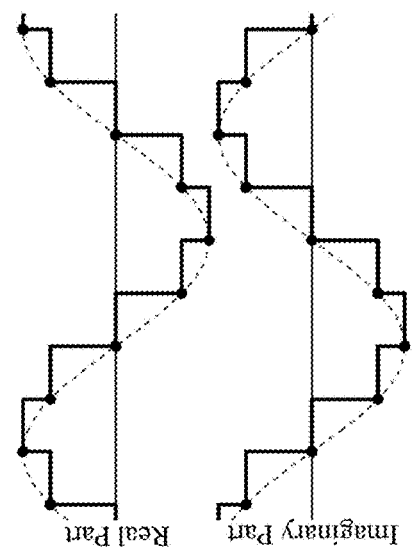

FIGS. 2A and 2B illustrate exemplary graphs of local oscillator (LO) signal and gain waveforms for I/Q mixers. An ideal mixer multiplies an incoming RF signal with a complex LO sinusoid, which frequency shifts a desired frequency channel to DC. As shown in FIG. 2A, an ideal I/Q hard-switched mixer approximates the complex sinusoid by two square waves that are offset by a quarter period, however, this approximation results in aliasing of signals around the $3^{rd}$, $5^{th}$ and $7^{th}$ harmonics, and so on. Although attenuated relative to the desired frequency, this undesired signal folding may be unacceptable for a true wideband receiver. In addition, this signal folding also applies to noise, and can limit the noise figure (NF) to 0.9 dB because of antenna noise folding alone. The I/Q mixer shown in FIG. 2A can be viewed as a multiplication of the RF signal with a complex sinewave that is sampled-and-held at twice the Nyquist frequency. Therefore, to shift these aliasing terms to higher frequencies, the sampling rate can be increased. For instance, if the LO waveform is sampled-and-held at eight times the receive frequency, the first alias is moved to 7th harmonic and is attenuated by 17 dB relative to the desired signal, as shown in FIG. 2B. Also, increasing the sampling rate also improves conversion loss, and the minimum achievable noise figure also improves to 0.2 dB. In some implementations, the oversampling may come at the cost of an increased burden on LO generation circuitry.

Figure 3B:
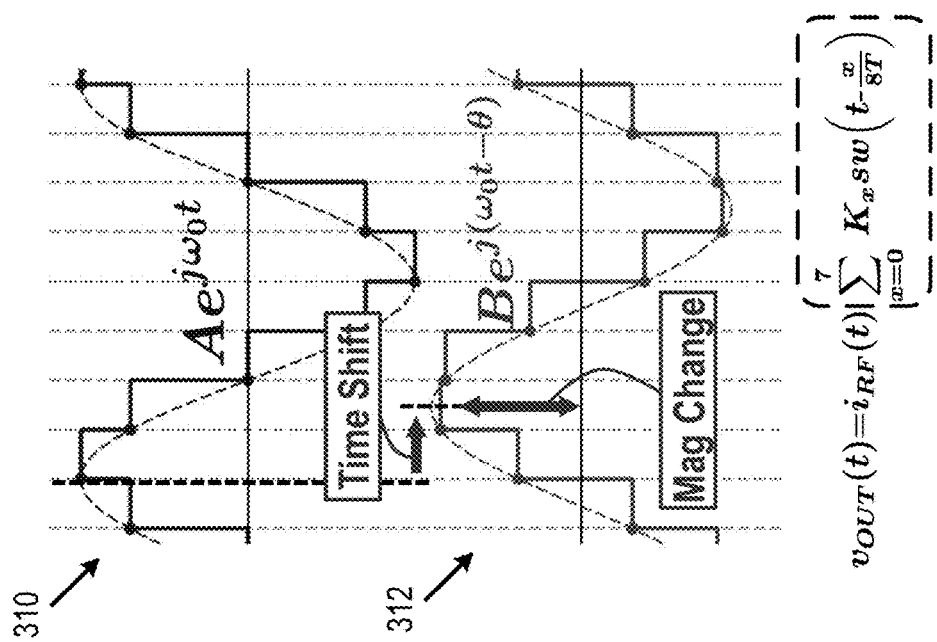
FIG. 3B illustrates exemplary graphs of LO signal waveforms for a mixer.
Figure 3A:
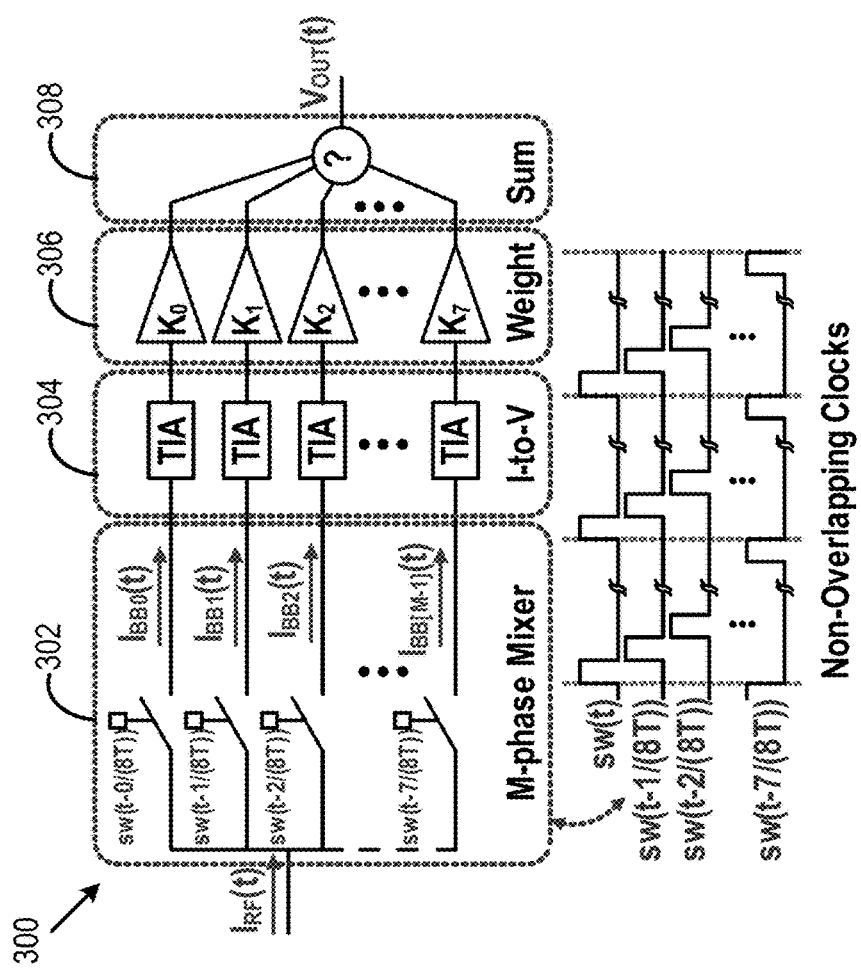
FIG. 3A is a diagram of a mixer with associated LO clock waveforms.

FIG. 3A is a diagram of a mixer 300 for the RF front end 104 with associated LO clock waveforms, and FIG. 3B illustrates exemplary graphs of LO signal waveforms for the mixer 300. In some implementations, the oversampling mixer 300 is a passive-mixer-based mixer with eight phases. A RF current is first down-converted by mixer switches 302 driven by non-overlapping clocks, sw(t−x/MT)), x∈[0, ... , M−1]. The down-converted currents are then scaled to voltages at transinductance amplifiers (TIAs) 304, appropriately weighted at weighting blocks 306 and summed at summing block 308. The TIA output is given by:

$$v_{OUT}(t) = i_{RF}(t) \sum_{x=0}^{M-1} K_x sw\left(t - \frac{x}{MT}\right), \quad \text{(Eq. 1)}$$

which corresponds to the RF current multiplied by a summation of the product of the complex weighting constants, $[K_0, \ldots, K_{M-1}]$, and their associated clock waveforms, as shown in FIG. 3A. These constants can be determined by the processor 108 so that the output of the summation block 308 generates a sampled version of an ideal complex sinusoid, which becomes the effective LO that down-converts the incoming RF signal. For example, by setting $$K_x = |\mathcal{G}_{ARB}|\left(\cos\left(\frac{2\pi x}{M} - \angle\mathcal{G}_{ARB}\right) - j\sin\left(\frac{2\pi x}{M} - \angle\mathcal{G}_{ARB}\right)\right), \quad \text{(Eq. 2)}$$

for $x = 0, 1, \ldots, M-1$, an oversampled complex LO with a predetermined magnitude of $|g_{ARB}|$ down-converts the RF signal. In the frequency domain, the output around base-band is given by $$V_{OUT}\{\Delta\omega\} = \mathcal{G}_{ARB} \times \sum_{g=-\infty}^{\infty} \mathrm{sinc}\left(\frac{1-gM}{M}\pi\right) I_{RF}\{(1-gM)\omega_{LO} + \Delta\omega\}, \quad \text{(Eq. 3)}$$

where $g_{ARB} = |g_{ARB}|e^{j\angle g_{ARB}}$ is an predetermined baseband gain, $\omega_{LO}$ is a clock frequency, and $\Delta\omega$ is some carrier offset. Therefore, as well as receiving desired signals around $\omega_{LO} + \Delta\omega$, signals at offsets of integer multiples of $M\omega_{LO}$ are also down-converted. In one implementation, M=8 is selected as the number of phases associated with the LO.

One feature of the mixer 300 is that the phase of the clock pulses are modified by changing the baseband weighting constants, which results in an complex periodic waveform being generated with a predetermined amount of phase offset. For example, in FIG. 3B, graphs 310 and 312 illustrate a time shift and magnitude change for the output of the summation block 308 that can be achieved by modifying the complex weighting constants for the phases of the mixer 300. The time shift and magnitude modification allows for a correction in phase (and magnitude) variations between two down-conversion paths in a noise-cancelling receiver without employing two separate LO chains. Details regarding the down-conversion paths of the noise-cancelling receiver are discussed further herein.

Figure 4:
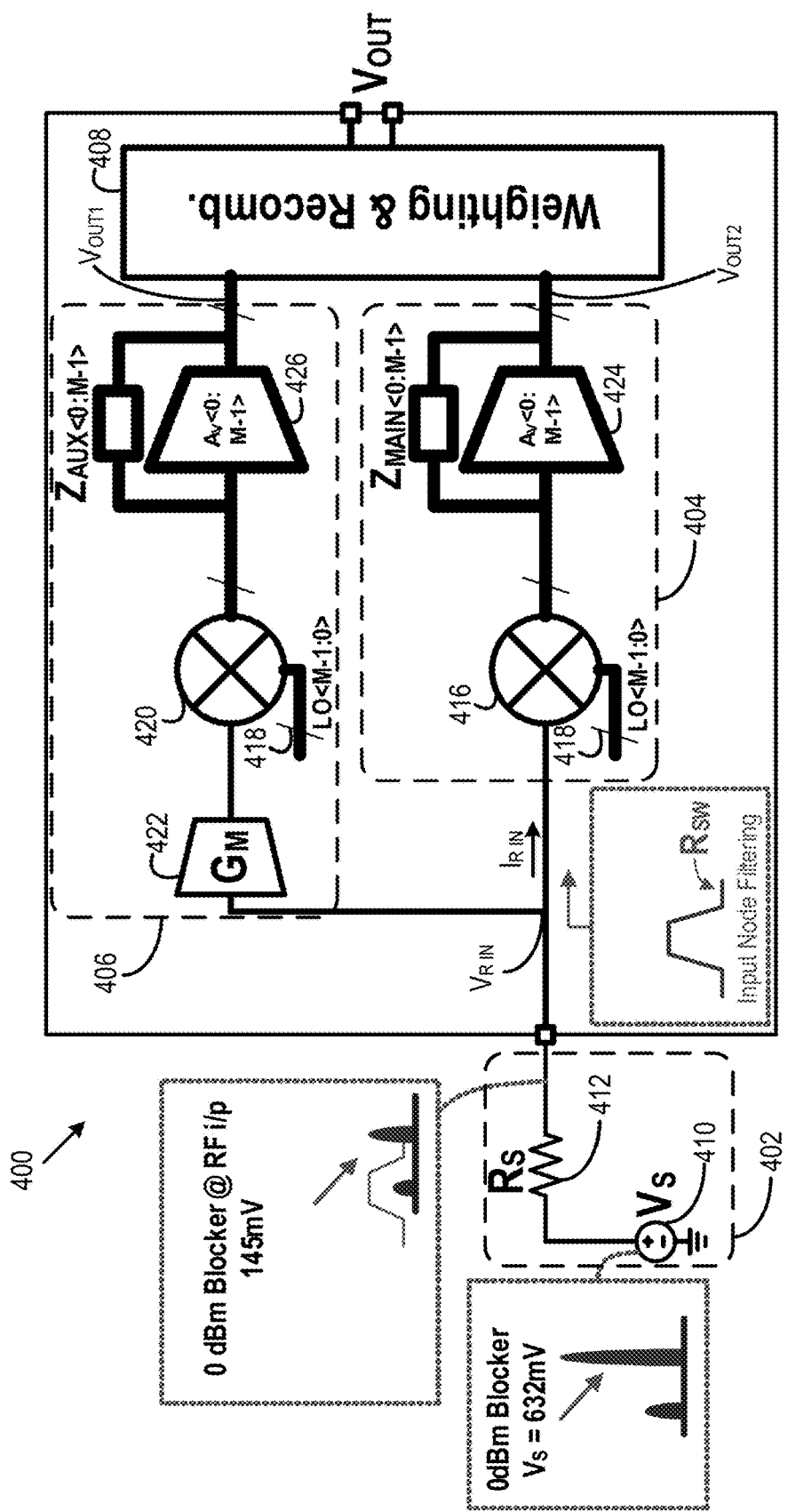
FIG. 4 is an exemplary diagram of a receiver front end.

FIG. 4 illustrates a mixer-first receiver front end 400 in accordance with embodiments of the present disclosure that utilizes noise canceling techniques. The mixer-first receiver front end 400 can be implemented in various devices to receive wireless RF signals, such as cell phones, wireless modems, wireless routers and access points, etc. For example, the mixer-first receiver front end 400 can be implemented in the RF front end 104 of the communication device 100.

The mixer-first receiver front end 400 includes an antenna 402, two down-conversion paths 404 and 406, and a baseband processing block 408 that performs weighting and recombination of the outputs of the two down-conversion paths 404 and 406. The receiver front end 400 also includes a transconductance cell 422, passive mixers 416 and 420, and transimpedance amplifiers 424 and 426.

The antenna 402 can be represented by a voltage source 410 in series with a source output resistance (RS) 412, which can be, for example, 50 Ohms. In some implementations, the source output resistance 412 can be matched by an input matching resistance in main down-conversion path 404 to avoid signal reflections and maximize power transfer from the antenna 402 to the other down-stream elements of the mixer-first receiver front end 400.

In one or more implementations, the transconductance cell ($G_M$) 422 is included in the auxiliary down-conversion path 406 to convert an RF signal input (e.g., $V_{R_{IN}}$) into a corresponding current signal. The transconductance cell 422 can be implemented, for example, as an inverter. The transconductance cell 422 includes logic, circuitry and/or interfaces that are configured to output a current that is proportional to a voltage input to the transconductance cell 422.

The passive mixers 416 and 420 each include logic and/or circuitry that may provide for generation of inter-modulation products resulting from mixing the RF signal input 205 with LO signals (e.g., LO0, LO1, . . . , LOM−1) generated by the LOGEN 112 (FIG. 1). In one or more implementations, the passive mixers 416 and 420 are metal-oxide semiconductor field effect transistors (MOSFETs). Specifically, the passive mixers 416 and 420 may be n-channel MOSFETs (e.g., NMOS). However, the passive mixers 416 and 420 can be implemented using other switching devices. In one or more implementations, the passive mixers 416 and 420 are configured to operate in their linear region when powered on.

The transimpedance amplifier (TIA) 426 includes logic, circuitry and/or interfaces that are configured to output a voltage that is proportional to a current input to the TIA 426. Similarly, the TIA 424 includes logic, circuitry and/or interfaces that are configured to output a voltage that is proportional to a current input to the TIA 424.

In operation, the two down-conversion paths 404 and 406 down-convert an RF signal received by the antenna 402 to baseband or some IF and to substantially cancel thermal noise generated by the input matching resistance $R_{SW}$, while substantially avoiding voltage gain of the RF signal. The main down-conversion path 404 includes passive mixers 416 to down-convert the current signal $I_{R_{IN}}$ flowing through an input matching resistance by an amount substantially equal to the frequency of a LO signal 418 (e.g., LO0-LOM-1). The current signal $I_{R_{IN}}$ includes both the RF signal received by the antenna 402 and the thermal noise signal generated by the input matching resistance $R_{SW}$. The auxiliary down-conversion path 406 includes a passive mixer 420 to down-convert the voltage signal $V_{R_{IN}}$ measured between the source output resistance 412 and the input matching resistance $R_{SW}$ by an amount substantially equal to the frequency of the same LO signal 418 used by passive mixer 416. The frequency of the LO signal 418 can be tuned, for example, over a wide frequency range based on a position of a desired channel in the spectrum of the received RF signal. Like the current signal $I_{R_{IN}}$, the voltage signal $V_{R_{IN}}$ includes both the RF signal received by the antenna 402 and the thermal noise signal generated by the input matching resistance $R_{SW}$.

Although the thermal noise signal and the RF signal appear in both the current signal $I_{R_{IN}}$ and the voltage signal $V_{R_{IN}}$, the thermal noise signal in $V_{R_{IN}}$ is 180 degrees out of phase with the thermal noise signal in $I_{R_{IN}}$, while the RF signal in $V_{R_{IN}}$ is in-phase with the RF signal in $I_{R_{IN}}$. Given this, the TIAs 424 and 426 can be respectively used to convert and scale the down-converted current signals at the output of passive mixers 418 and 420, into two voltage signals $V_{OUT1}$ and $V_{OUT2}$ such that, when $V_{OUT1}$ and $V_{OUT2}$ are added together (or potentially sensed differentially depending on the relative polarities of the gains applied by the transfer functions), the thermal noise generated by input matching resistance is substantially canceled, while the RF signal received by antenna 402 is reinforced. In one or more implementations, the voltage signals $V_{OUT1}$ and $V_{OUT2}$ define the In-phase (I) and Quadrature (Q) components of the RF signal input.

In general, the transfer functions of the TIAs 424 and 426 are determined based on their feedback networks. In one implementation, the feedback networks for the TIAs 224 and 226 include impedance elements $Z_{MAIN}$ and $Z_{AUX}$ that can have a resistive element and a capacitive element in parallel. The capacitive elements of the impedance elements $Z_{MAIN}$ and $Z_{AUX}$ can be included for stability purposes and the resistive elements of the impedance elements $Z_{MAIN}$ and $Z_{AUX}$ can be included to set a current-to-voltage conversion gain for the TIAs 224 and 226, respectively. Without loss of generality, if the capacitive elements are ignored, it can be shown that the current-to-voltage conversion gains are substantially equal to the negative of the resistance values of the resistance elements, assuming that TIAs 224 and 226 have sufficient open-loop gains.

Based on the exemplary configuration of mixer-first receiver front end 400 illustrated in FIG. 4, by setting the resistance values for the resistance elements of $Z_{MAIN}$ and $Z_{AUX}$ equal to one another, the magnitude of the two voltage signals $V_{OUT1}$ and $V_{OUT2}$ can be adjusted such that, when $V_{OUT1}$ and $V_{OUT2}$ are added together (or potentially sensed differentially depending on the relative polarities of $\alpha$ and $r_m$), the thermal noise generated by input matching resistance is substantially canceled, while the RF signal received by antenna 402 is reinforced. However, other settings for the resistance elements are possible and can be used for other RF receiver front end configurations.

By employing passive mixers 416 and 420 (which are bidirectional) and TIAs 424 and 426, a virtual ground at the negative summing nodes of TIAs 424 and 426 appears ideally at the RF side of passive mixers 416 and 420 where the RF signal from the antenna 402 is received, thereby suppressing voltage swing prior to baseband or IF filtering to remove blockers. Thus, because mixer-first receiver front end 400 suppresses noise, while minimizing voltage gain, the mixer-first receiver front end 400 can be considered blocker-tolerant. In addition, because passive mixer 416 is bidirectional, the noise of the TIA 224 is up-converted at the input of the mixer-first receiver front end 400 and is canceled along with the thermal noise generated by input matching resistance in the main down-conversion path 404. The noise of the TIA 226 contributes negligibly when driven by a current source-like transconductance cell 222.

Following down-conversion of the RF signal received by antenna 402 by down-conversion paths 404 and 406 as described above, baseband processing block 408 processes $V_{OUT1}$ and $V_{OUT2}$ using one or more processors and/or circuits. In one implementation, the processor 108 and/or baseband processing module 106 of the communication device 100 executes one or more software processes associated with the functionality of the baseband processing block 408. For example, baseband processing block 408 can low-pass filter $V_{OUT1}$ and $V_{OUT2}$, either separately or after having been added (or subtracted) together, to remove blockers and other interference. In addition, baseband processing block 408 can further perform digitization of $V_{OUT1}$ and $V_{OUT2}$, either separately or after having been added (or subtracted) together, using one or more analog-to-digital converters (ADCs). The ADCs can be, for example, delta-sigma ADCs. In addition, baseband processing block 408 can perform low-pass filtering and digitization of $V_{OUT1}$ and $V_{OUT2}$ in any order relative to each other. Further, baseband processing block 408 can demodulate the down-converted RF signal contained within $V_{OUT1}$ and $V_{OUT2}$ to recover information.

The LO signal 418 used by passive mixers 416 and 420 in FIG. 4 to down-convert a received RF signal typically approximates a square waveform. Unlike a single-tone sinusoidal waveform, a square waveform contains harmonics at specific multiples of the fundamental frequency of the LO signal. Consequently, undesired portions of the RF signal located at these harmonics can be down-converted by the passive mixers 416 and 420 and interfere with a desired portion of the RF signal at baseband.

In some implementations, the mixer-first receiver front end 400 can be designed to limit interference caused by these higher-order harmonic effects. For example, the mixers 416 and 420 respectively included in down-conversion paths 404 and 406 can be implemented as a multi-phase passive harmonic rejection mixer. For example, the mixers 416 and 420 can be an eight-phase passive harmonic rejection mixer constructed from four single-balanced passive mixers. Correspondingly, the TIAs 224 and 226 can be implemented by multiple TIAs (e.g., four) that are each coupled to a respective one of the single-balanced passive mixers that correspond to each of the LO phases. It should be noted that, in other embodiments, lower or higher order passive harmonic rejection mixers can be used.

In some implementations, the single-balanced passive mixers included in each down-conversion path 404 and 406 receive a respective set of LO signals. For example, for an eight-phase LO mixer (with phases 0 through 7), a first respective passive mixer in down-conversion paths 404 and 406 receives LO signals 0 and 4, a second respective passive mixer in down-conversion paths 404 and 406 receives LO signals 1 and 5, a third respective passive mixer in down-conversion paths 404 and 406 receives LO signals 2 and 6, and a fourth respective passive mixer in down-conversion paths 404 and 406 receives LO signals 3 and 7. In this example, the exemplary LO signals are non-overlapping and have a duty-cycle substantially equal to 12.5%. It can be shown that, by using appropriately weighted combinations of the outputs of the four TIAs in each down-conversion path 404 and 406, the amount of noise that folds down to baseband as a result of the higher-order harmonic effects discussed above can be reduced and/or nulled. The weighting and recombination can be performed by baseband processing block 408.

It should be noted that, in some implementations, the receiver front end 400 can be further constructed as a fully differential receiver front end. In other words, the receiver front end 400 can be further constructed to process a differential RF signal received by the antenna 402 by replacing the transconductance cell 422 with a differential transconductance cell and by replacing the passive mixers in each down-conversion path 404 and 406 with differential passive mixers.

In harmonic selective full band capture (FBC) receivers described in further detail herein, the receiver front end can selectively receive one or more down-converted RF spectrum segments by modifying weighting factors of transconductance cells associated with the TIAs for each of the non-overlapping LO phases. By amplifying spectrum segments associated with a received signal in desired frequency bands and attenuating undesired spectrum segments, the dynamic range and sampling speed of the ADCs can be reduced while still achieving wideband frequency coverage.

Figure 5A:
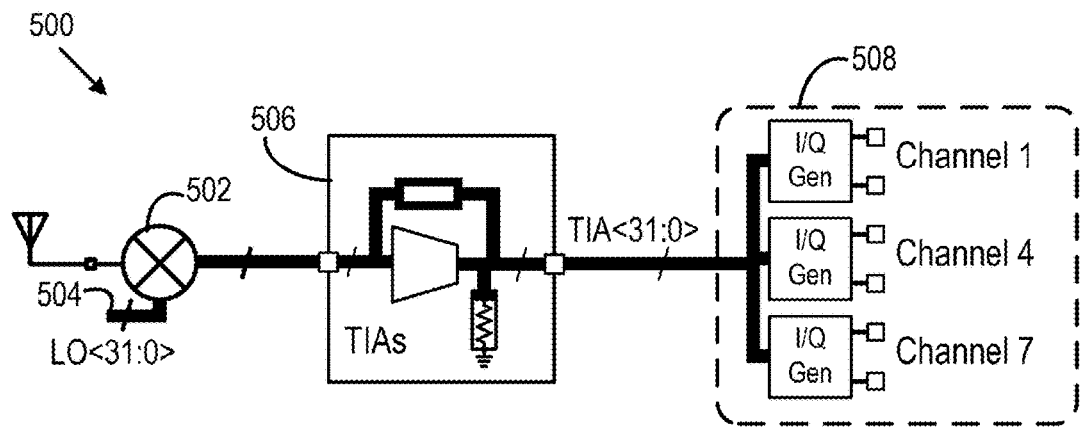
FIG. 5A illustrates an exemplary diagram of a portion of a harmonic selective full band capture (FBC) receiver front end.

For example, FIG. 5A illustrates an exemplary diagram of a harmonic selective full band capture (FBC) receiver front end 500. The receiver front end 500 includes a multi-phase mixer 502 that is tuned by non-overlapping LO signals 504 that correspond to each of the M phases. In one implementation, the mixer 502 is a 32-phase mixer that is tuned by 32 non-overlapping LO signals 504. The receiver front end 500 can also include TIAs 506 at the outputs of each phase of the mixer 502 that can be configured to receive M down-conversion signals from the respective phases of the mixer 502. Each of the TIAs 506 includes one or more transconductance cells with a particular transconductance weighting to output a weighted current signal. Outputs of the TIAs 506 are coupled to a common feedback impedance, which is coupled to an input of a respective one of the TIAs 506 to convert the weighted current signal into a voltage output with a voltage gain such that a desired signal associated with one or more selected harmonics realizes the voltage gain and undesired signals corresponding to harmonics at blocker or other undesired signal locations are rejected without amplification.

Each of the outputs of the multi-phase mixer 502 contains down-converted spectrums corresponding to the $\pm 1^{st}$ to the $\pm(M/2-1)^{th}$ harmonics of a fundamental LO frequency. For the $n^{th}$ baseband outputs of the mixer 502, the received signals around the k-th harmonic, e.g. $k*F_{LO}$, have a phase shift of $2\pi kn/M$. Therefore, by applying sinusoidal gain coefficients and combining the M baseband outputs, signals around selected harmonics can be amplified while others are rejected. Based on this principle, one or more harmonics from the $\pm 1st$ and $\pm(M/2-1)^{th}$ harmonic can be selectively received by weighting coefficients that correspond to spectrum segments associated with each of the harmonics in the received signal spectrum. In effect, the broadband spectrum is channelized into M/2 narrower spectrum segments or channels and can therefore be sampled by ADCs with a speed that is M times slower than high-speed ADCs that are used in DS receivers.

Figure 5B:
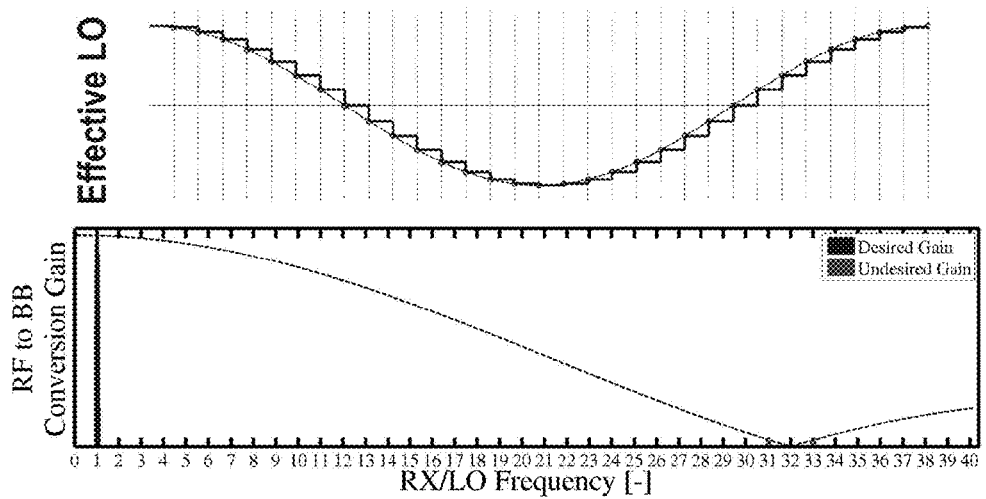
FIG. 5B illustrates exemplary graphs of LO signal and gain waveforms for a harmonic selective FBC receiver front end.
Figure 6:
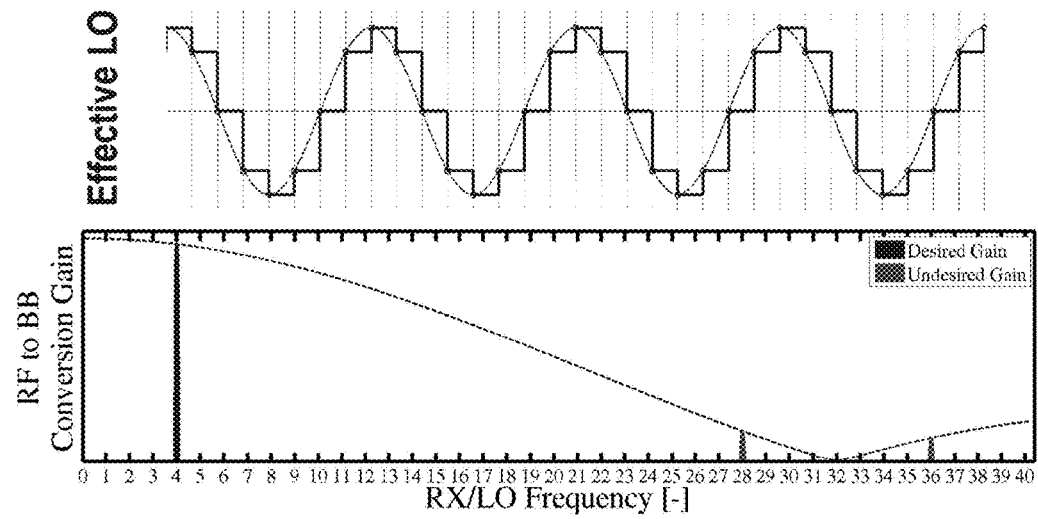
FIG. 6 illustrates exemplary graphs of LO signal and gain waveforms for a harmonic selective FBC receiver front end.
Figure 7:
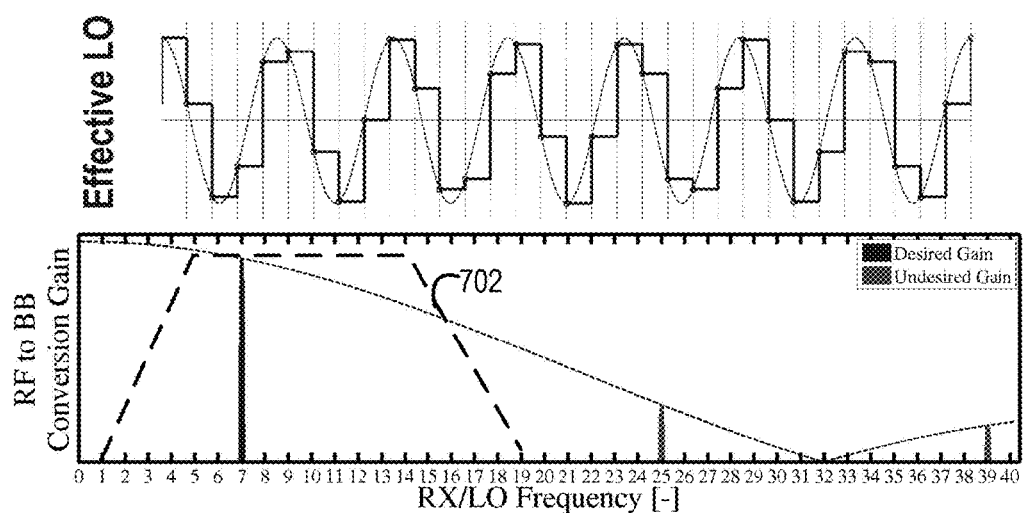
FIG. 7 illustrates exemplary graphs of LO signal and gain waveforms for a harmonic selective FBC receiver front end.

For the receiver front end 500, baseband processing module 508 controls the weighting coefficients for each of the received spectrum segments for the $\pm 1^{st}$ to the $\pm(M/2-1)^{th}$ harmonics of the fundamental LO frequency. In one implementation, the spectrum segments associated with the $1^{st}$, $4^{th}$, and $7^{th}$ harmonics of the fundamental LO frequency correspond to the desired spectrum segments, and all of the other received spectrum segments are undesired spectrum segments. Therefore, the processing circuitry of the baseband processing module 508 determines the weighting coefficients so that the spectrum segments associated with the $1^{st}$, $4^{th}$, and $7^{th}$ harmonics are amplified, and all other spectrum segments are rejected. For example, FIGS. 5B, 6, and 7 illustrate exemplary graphs of LO signals and gain waveforms for the receiver front end 500. The graphs in FIG. 5B correspond to the mixer output for the $1^{st}$ harmonic, the graphs in FIG. 6 correspond to the mixer output for the $4^{th}$ harmonic, and the graphs in FIG. 7 correspond to the mixer output for the $7^{th}$ harmonic.

In some implementations, the processing circuitry determines the desired spectrum segments to be amplified based on frequency bands associated with the received signal. For example, the frequency bands of the received signal can be determined based on frequency channels associated with a wireless signal protocol of the received signals that can include Long Term Evolution (LTE), Wireless Local Area Network (WLAN), Global System for Mobile Communication (GSM), Global Positioning System (GPS), Blutetooth (BT), or any other type of wireless signal protocol that is known. The processing circuitry can also determine the undesired spectrum segments to be rejected based on frequency locations of blockers or any other type of interference signal.

Furthermore, in some wireless applications, the receiver receives a limited number of signals in predetermined frequency bands. In this case, the baseband processing module 508 can tune the LO frequency according to the frequency of the signals such that after down-conversion, the baseband frequencies of the received signal are reduced or minimized, which can also further reduce a sampling speed of the ADCs. Also, in the presence of out-of-band blockers, the LO frequency can be tuned such that the blockers are attenuated by low pass filters in the baseband paths. In addition, the baseband processing module 508 can also apply anti-aliasing filter 702 in the RF domain to remove out-of-band blockers at the $25^{th}$ and $39^{th}$ harmonics while retaining the signal information at the desired $7^{th}$ harmonic.

The filtering of the blockers results in a relaxation of the dynamic range specifications of sampling ADCs. For instance, if two arbitrary LTE/WLAN/GPS/BT signals (800 MHz to 1 GHz, 1.4 GHz to 1.6 GHz, or 1800 GHz to 2500 GHz) are received, the LO frequency is tunable around 150 MHz with 32 phases and 30% tuning range, and blockers may be as close as 80 MHz away from the signals. By tuning the LO frequency, the baseband blocker frequency, $F_{b,out}$, to signal frequency, $F_{s,out}$, a harmonic rejection ratio is greater than 2.5 and $F_{s,out}$ is less than 50 MHz. Assuming 4th-order baseband low-pass filters are employed, the blockers can be attenuated by at least 30 dB, which leads to a reduction by twenty times in the power consumption of the sampling ADCs under Schreier FOM. The sampling speed of the ADCs under Nyquist criteria can also be reduced from 300 MHz to 100 MHz.

Figure 8:
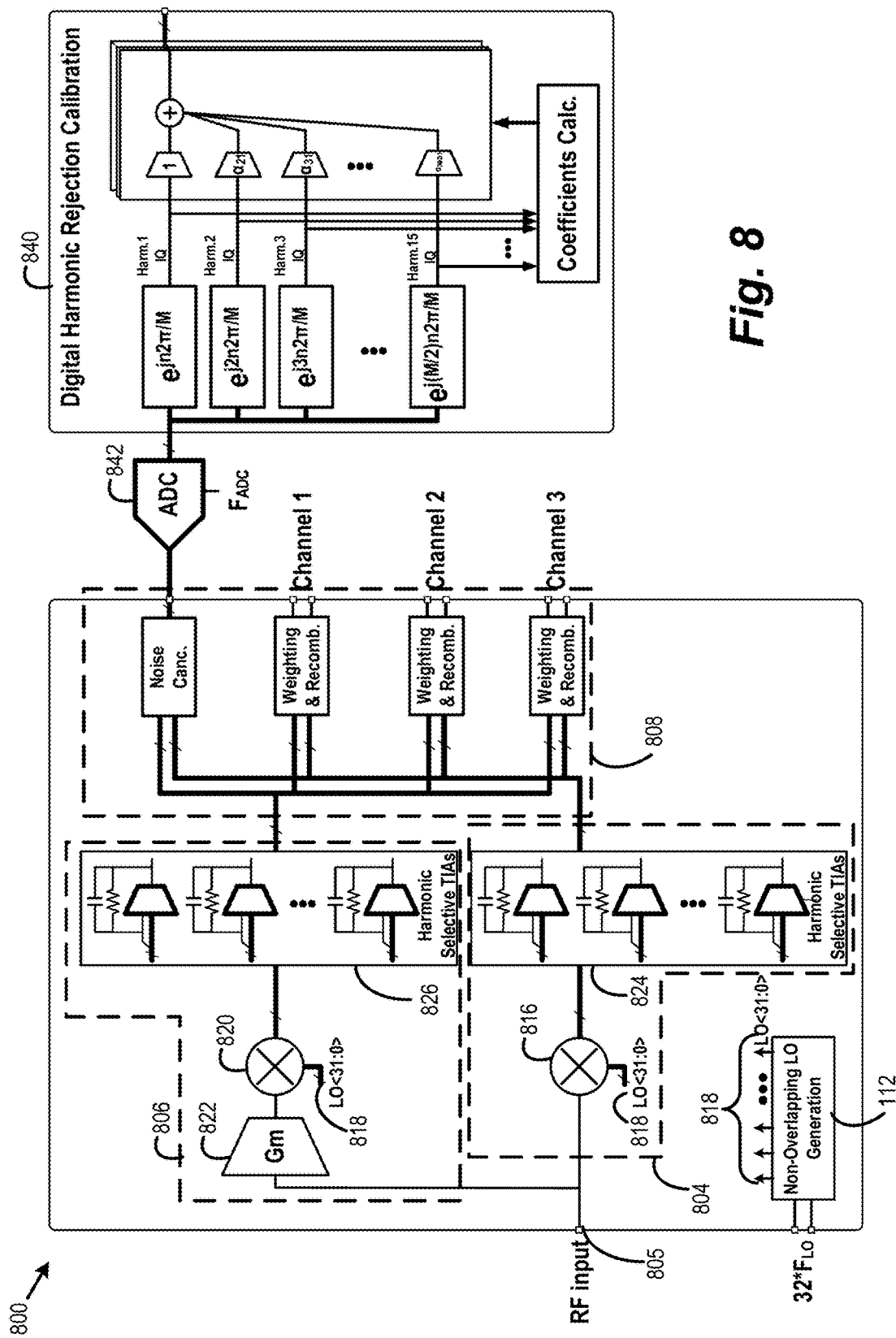
FIG. 8 is an exemplary diagram of a harmonic selective FBC receiver front end.

FIG. 8 illustrates a schematic diagram of a harmonic selective FBC receiver front end 800. In some examples, a source of interference in the harmonic selective receiver with the receiver front end 800 is that blockers that are present at undesired harmonics associated with down-converted spectrum segments, which can be down-converted within the pass-band at the baseband. The receiver front end 800 implements noise-cancelling techniques and harmonic rejection TIAs while amplifying one or more desired spectrum segments that correspond to a received signal spectrum and rejecting one or more undesired spectrum segments that correspond to blocker frequencies. The mixer-first receiver front end 800 can be implemented in various devices to receive wireless RF signals, such as cell phones, wireless modems, wireless routers and access points, etc. For example, the mixer-first receiver front end 800 can be implemented in the RF front end 104 of the communication device 100. The receiver front end 800 has some structural elements that are similar to the receiver front end 400; however, the receiver front end 800 provides the ability to amplify the desired spectrum segments while rejecting the undesired spectrum segments. The receiver front end 800 also has similar structural elements to the receiver front end 500 but also includes two down-conversion paths 804 and 806 to provide improved noise cancelling along with a digital calibration block 840 to reduce the effects of phase and amplitude mismatches that may occur in the LO down-conversion.

In some implementations, the receiver front end 800 is a mixer-first receiver front end that includes two down-conversion paths 804 and 806, and a baseband processing block 808 that performs weighting and recombination of the outputs of the two down-conversion paths 804 and 806 that results in amplification of one or more desired spectrum segments. The receiver front end 800 also includes a transconductance cell 822, multi-phase mixers 816 and 820, and transimpedance amplifiers 824 and 826.

In one or more implementations, the transconductance cell ($G_M$) 822 is included in the auxiliary down-conversion path 806 to convert an RF signal input (e.g., $V_{R_{IN}}$) into a corresponding current signal. The transconductance cell 822 can be implemented, for example, as an inverter. The transconductance cell 822 includes logic, circuitry and/or interfaces that are configured to output a current that is proportional to a voltage input to the transconductance cell 822.

The passive mixers 816 and 820 each include logic and/or circuitry that may provide for generation of inter-modulation products resulting from mixing the RF signal input 805 with LO signals 818 (e.g., LO0, LO1, . . . , LOM–1) generated by the LOGEN 112 (FIG. 1). In one or more implementations, the mixers 816 and 420 are metal-oxide semiconductor field effect transistors (MOSFETs). Specifically, the passive mixers 816 and 820 may be n-channel MOSFETs (e.g., NMOS). However, the passive mixers 816 and 820 can be implemented using other switching devices. In one or more implementations, the passive mixers 816 and 820 are configured to operate in their linear region when powered on.

Like the receiver front end 500, the receiver front end 800 includes the mixers 816 and 820 in both down-conversion paths 804 and 806, which are multi-phase mixers that are tuned by non-overlapping LO signals 818 that correspond to each of the M phases. In one implementation, the mixers 816 and 820 are 32-phase mixers that are tuned by 32 non-overlapping LO signals 504. The down-conversion paths 804 and 806 also include TIAs 824 and 826 at the outputs of each phase of the mixers 816 and 820 that can be configured to receive M down-conversion signals from the respective phases of the mixers 816 and 820. Each of the TIAs 824 and 826 includes one or more transconductance cells with a particular transconductance weighting to output a weighted current signal. Outputs of the TIAs 824 and 826 are coupled to a common feedback impedance, which is coupled to an input of a respective one of the TIAs 824 and 826 to convert the weighted current signal into a voltage output with a voltage gain such that a desired signal associated with one or more selected harmonics realizes the voltage gain and undesired signals corresponding to harmonics at blocker or other undesired signal locations are rejected without amplification. In some implementations, the TIAs 824 and 826 are referred to as harmonic selective TIAs.

For the receiver front end 800, baseband processing module 808 determines and controls the weighting coefficients for each of the received spectrum segments for the $\pm 1^{st}$ to the $\pm (M/2-1)^{th}$ harmonics of the fundamental LO frequency. In one implementation, the baseband processing module 808 determines the weighting coefficients for the spectrum segments associated with the three harmonics (e.g., Channel 1, Channel 2, Channel 3) of the fundamental LO frequency that correspond to the desired spectrum segments, and all of the other received spectrum segments are undesired spectrum segments.

The transconductance ($G_M$) stage associated with each of the harmonic selective TIAs 824 and 826 in the down-conversion paths 804 and 806 takes the outputs of the mixers 816 and 820, and combines them with sinusoidal weighting coefficients determined by the processing circuitry of the baseband processing module 808 based on whether the TIAs 824 and/or 826 are associated with a desired or undesired spectrum segment. For example, for the main down-conversion path 804, if the $k^{th}$ harmonic is associated with a desired spectrum segment, the coefficient of the $n^{th}$ mixer output is $_{[n]}=\cos(2\pi kn/M)$. In the case of multiple harmonics being received, the transconductance ($G_M$) weighting coefficient for the corresponding TIA 824 in the main down-conversion path 804 corresponds to a combination of the selected harmonics:

$$g_{m[n], main} = G_{m,EFF} \times \sum_i \cos\frac{2\pi k_i n}{M} \qquad \text{(Eq. 4)}$$

With this approach, the effective transconductance value ($G_{m,EFF}$) for the TIAs 824 in the main down-conversion path 804 is large for the desired harmonics and zero for the undesired harmonics. Therefore, only desired harmonics are amplified by the TIAs 824. In some implementations, a DC offset is introduced to the transconductance ($G_M$) units for the TIAs to maintain positive values for the transconductance ($G_M$) weighting coefficients, which may result in the $0^{th}$ harmonic not being rejected as well as increased power consumption. However, the $0^{th}$ harmonic can be rejected if desired with filtering by DC block capacitors at the RF input 805. The increased power consumption may result in higher noise from the transconductance ($G_M$) stages of the TIAs. However, as the number of received desired harmonics increases, the amount of DC offset applied to maintain positive values for the transconductance ($G_M$) weighting coefficients decreases, which reduces the power consumption. In the case where all harmonics in the received spectrum are associated with desired spectrum segments, no harmonic rejection is performed and the harmonic selective TIAs 824 becomes single-input single-output TIAs. By applying the determined transconductance ($G_M$) weighting coefficients to the harmonic selective TIAs in the main down-conversion path 804 associated with the desired spectrum segments and setting the weighting coefficients to zero for the undesired spectrum segments, the main down-conversion path 804 may not saturated by harmonic blockers.

For the auxiliary down-conversion path 806, the transconductance ($G_M$) weighting coefficients for the harmonic selective TIAs 826 vary slightly from the transconductance ($G_M$) weighting coefficients for the main down-conversion path 804. If the values for the transconductance ($G_M$) weighting coefficients in the main down-conversion path 804 are adopted for the TIAs 826 in the auxiliary down-conversion path 806, an input impedance seen by the undesired harmonic blockers can be large, which can result in large voltage swings at the output of the transconductance cell 822 and the input of the TIAs 826. Therefore, instead of completely nulling the effective $G_M$ for the undesired harmonics, an effective $G_M$ value is determined for the undesired harmonics, $G_{m,EFF,off}$, that is less than the effective $G_M$ value for the desired harmonics $G_{m,EFF,on}$, such that the voltage gain across the transconductance cell 822 is less than 10 dB. If $k_{d,i}$ and $k_{u,i}$ are sets of desired and undesired harmonics for the TIAs 826, respectively, then the $G_M$ values for the TIAs 826 in the auxiliary down-conversion path 806 can be described by:

$$g_{m[n],aux} = G_{m,EFF,on} \times \sum_i \cos\frac{2\pi k_{d,i} n}{M} + G_{m,EFF,off} \times \sum_i \cos\frac{2\pi k_{u,i} n}{M} \quad \text{(Eq. 5)}$$

As the $G_M$ value for the undesired harmonics, $G_{m,EFF,off}$, increases from zero, the voltage gain at the output of the TIAs 826 increases, thus trading off a reduced gain at the output of the transconductance cell 822. In one example, $$G_{m,EFF,off} = \frac{G_{m,EFF,on}}{5},$$

such that voltage gains at for both the main down-conversion path 804 and the auxiliary down-conversion path 806 are less than 10 dB so that a −10 dBm harmonic blocker can be tolerated.

The analog output of the baseband processing block 808 is digitized by M ADCs 842 with a sampling rate $F_{ADC}$, where M corresponds to the number of non-overlapping phases of the LO. In some implementations, due to phase and amplitude mismatches in the LO signals 818, a harmonic rejection ratio at the analog baseband outputs may be limited to 40~50 dB. Therefore, although the harmonic blockers may not saturate the receiver, the received signal can still become corrupted if the blockers fall on top of the desired signals after down-conversion is performed. In one example, the harmonic rejection ratio can be further improved by performing a digital calibration at digital calibration block 840. The digital calibration block 840 includes logic, circuitry and/or interfaces that are configured to receive and process signals, and the functions associated with the digital calibration block 840 may be executed as software processes by processing circuitry of the processor 108.

In some implementations, if the M baseband outputs from the baseband processing module 808 are digitized separately and harmonic recombination is completed digitally, a signal-to-noise ratio (SNR) specification for the M ADCs 842 can be relaxed by M times, resulting in a reduction in total power consumption. When the M baseband outputs are digitized, the mismatch information from the LO can be retained and digitally corrected at the digital calibration block 840 by applying amplitude corrections on each of the M outputs, so that the undesired harmonics between the $-(M/2-1)^{th}$ and $(M/2-1)^{th}$ can be fully rejected. In some implementations, the $-(M/2-1)^{th}$ to the $(M/2-1)^{th}$ harmonic includes all of the harmonics within a captured spectrum, e.g. the Nyquist bandwidth in an equivalent DS system. Higher order harmonics can be filtered in the RF domain because the higher order harmonics also cause aliasing issues and are outside the capturing range. For example, the filtering of the higher order harmonics in the RF domain can be performed by the filter 702 (FIG. 7).

In some implementations, calibration coefficients, $\alpha_{i,j}$, can be determined at the digital calibration block 840 by injecting a single test tone at the $i^{th}$ harmonic, monitoring the output power at the $i^{th}$ and $j^{th}$ harmonic outputs, P(i,j) and P(i,i). Any phase and/or amplitude mismatches during the LO down-conversion may result in signal leakage between the received LO harmonics. The signal leakage may be caused by signals from the desired spectrum segments or the undesired spectrum segments. For example, the $4^{th}$ harmonic of the received signal may correspond to a blocker signal frequency, which is rejected based on the transconductance values (GM) applied to the TIAs 824 and 826, but may still cause signal leakage into other desired spectrum segments associated with other harmonics. By inserting the test tone at the $4^{th}$ harmonic, the digital calibration block 840 can measure the amount of signal leakage from the $4^{th}$ harmonic into other received harmonics. The output power can be measured at the harmonics other than the $4^{th}$ harmonic caused by the test tone inserted at the $4^{th}$ harmonic and compared to the output power at the $4^{th}$ harmonic, and the calibration coefficient, $\alpha_{4,j}$, can be calculated for each of the other harmonics. The digital calibration block 808 can then apply the calibration coefficient to the harmonics of the received signal to remove the effects of any phase and/or amplitude mismatches that may have occurred during the LO down-conversion. The calibration coefficient for the test tone inserted $i^{th}$ harmonic can be described by the following equation:

$$\alpha_{i,j} = \frac{P(i,j)}{P(i,i)} \quad \text{(Eq. 6)}$$

In one example, the receiver front end 800 can be implemented on a test chip that is fabricated in 28 nm CMOS, and the core area of the harmonic selective FBC receiver is 3 mm². The LO is in 32-phase, thus 16 harmonics can be received with I/Q outputs, and the fundamental LO frequency is tunable from 127.5 MHz to 172.5 MHz. The 32 TIA outputs are digitized by external low-speed ADCs (ADAS1126). In addition, harmonic recombination blocks can also implemented on the chip.

Figure 9:
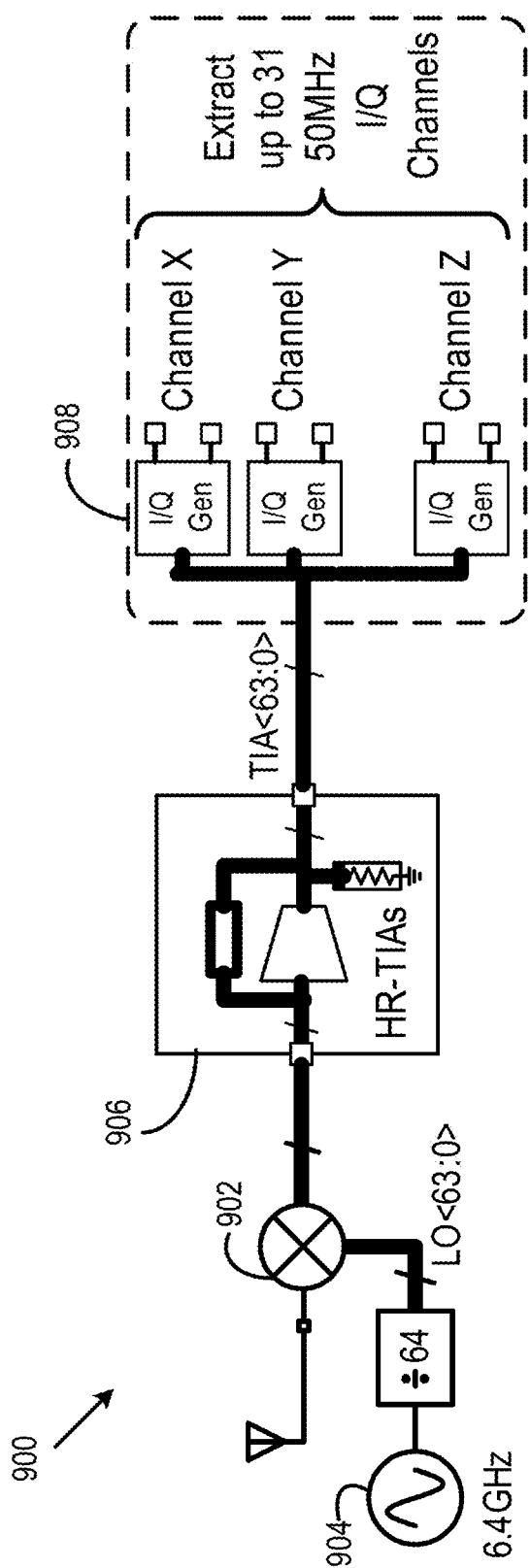
FIG. 9 is an exemplary diagram of a harmonic selective FBC receiver front end.

FIG. 9 is an exemplary diagram of a harmonic selective FBC receiver front end 900. the structure and function of the receiver front end 900 is substantially similar to the receiver front end 500 described previously. For example, the receiver front end 900 includes a multi-phase mixer 902 that is tuned by non-overlapping LO signals 904 that correspond to each of the M phases. In one implementation, the mixer 902 is a 64-phase mixer that is tuned by 64 non-overlapping LO signals 904. The receiver front end 900 can also include TIAs 906 at the outputs of each phase of the mixer 902 that can be configured to receive M down-conversion signals from the respective phases of the mixer 902. Each of the TIAs 906 includes one or more transconductance cells with a particular transconductance weighting to output a weighted current signal. Outputs of the TIAs 906 are coupled to a common feedback impedance, which is coupled to an input of a respective one of the TIAs 906 to convert the weighted current signal into a voltage output with a voltage gain such that a desired signal associated with one or more selected harmonics realizes the voltage gain and undesired signals corresponding to harmonics at blocker or other undesired signal locations are rejected without amplification. For the receiver front end 900, baseband processing module 908 controls the weighting coefficients for each of the received spectrum segments for the $\pm 1^{st}$ to the $\pm (M/2-1)^{th}$ harmonics of the fundamental LO frequency. For example, the baseband processing module 908 can determine the weighting coefficients for up to thirty-one 50 MHz I/Q channels (e.g., spectrum segments).

Figure 10:
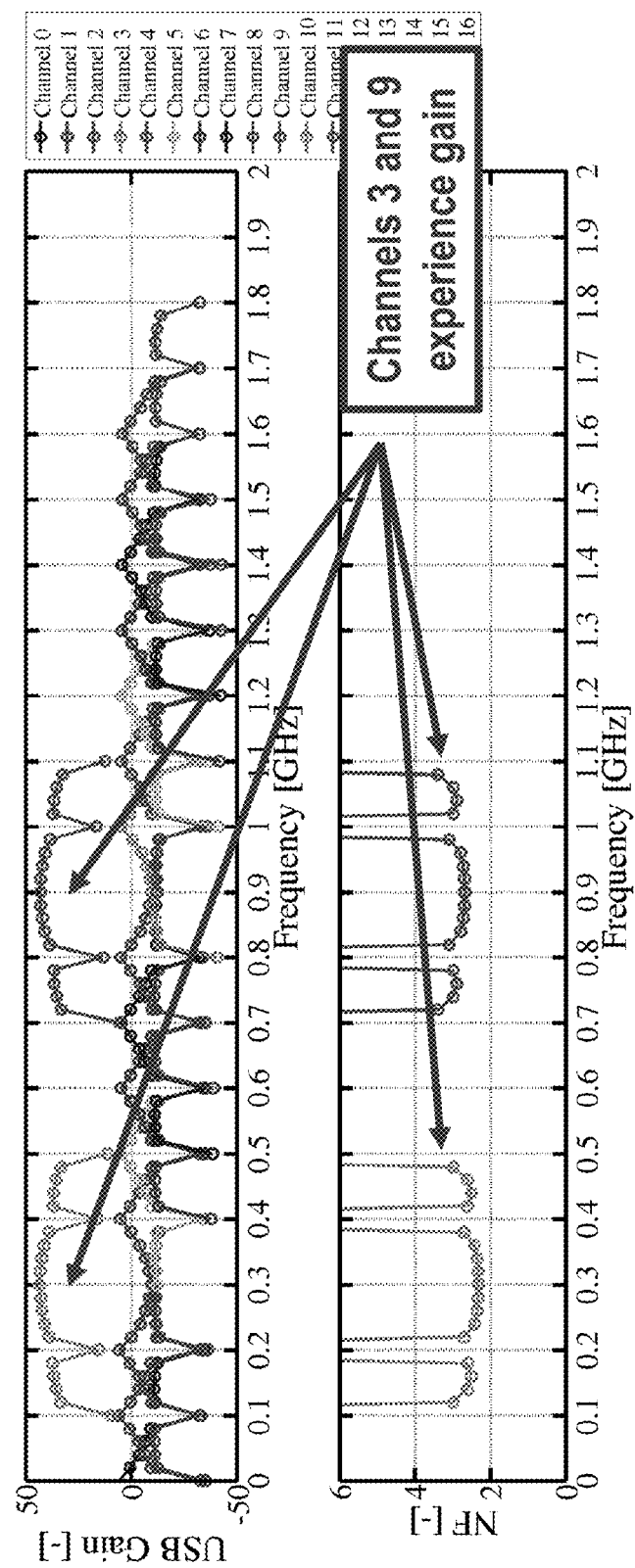
FIG. 10 illustrates exemplary graphs of gain and noise figure for a harmonic selective FBC receiver.

FIG. 10 illustrates exemplary graphs of gain and noise figure for a harmonic selective FBC receiver that includes the receiver front end 900 where the desired spectrum segments correspond to the $3^{rd}$ (300 MHz) and $9^{th}$ (900 MHz) LO harmonics output from the multi-phase mixer 902 with a LO fundamental frequency of 100 Mhz. As can be seen from the graph of the gain, the gain at the $3^{rd}$ and $9^{th}$ harmonics is greater than the gain for the other harmonics in the received spectrum, which can be achieved by determining and applying the transconductance $G_M$ weighting coefficients as described previously herein for the receiver front end 500 and the receiver front end 800. Likewise, the noise figure associated with the $3^{rd}$ and $9^{th}$ harmonics is less than for the other harmonics, which indicates that the $3^{rd}$ and $9^{th}$ harmonics have greater sensitivity than the other harmonics in the received spectrum.

Figure 11B:
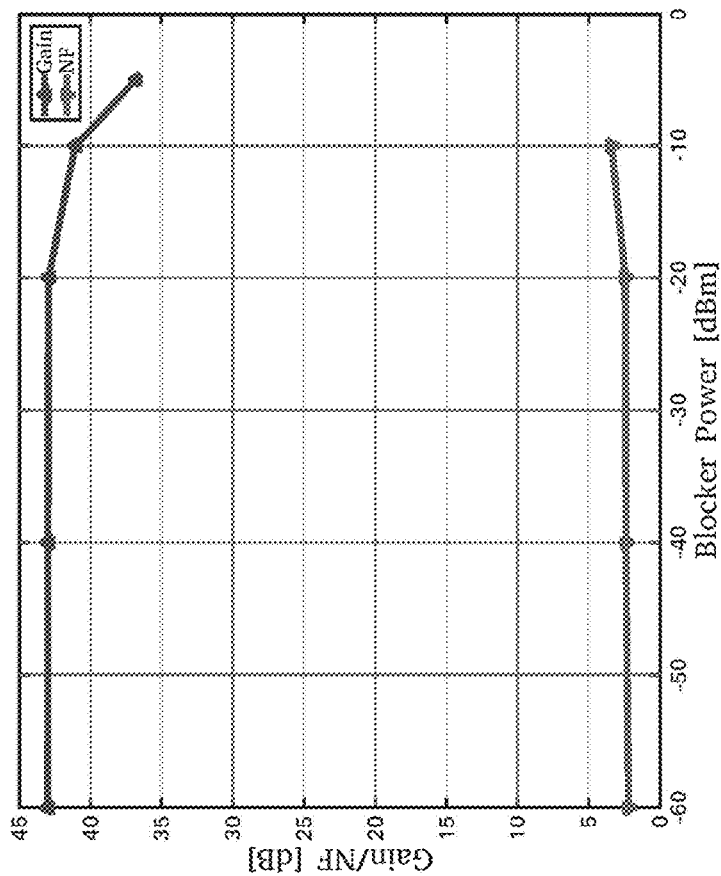
FIG. 11B illustrates exemplary graphs of gain and noise figure for a harmonic selective FBC receiver.
Figure 11A:
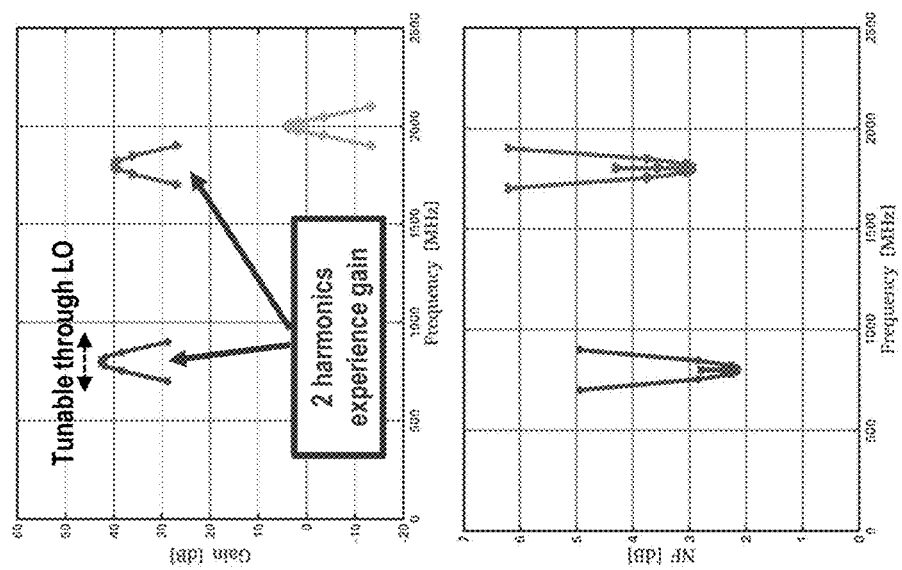
FIG. 11A illustrates exemplary graphs of gain and noise figure for a harmonic selective FBC receiver.

FIG. 11A shows a measured small signal gain and noise figure for reception of $4^{th}$ (800 MHz) and $9^{th}$ harmonics (1800 MHz) as desired spectrum segments based on a LO fundamental frequency of 200 MHz. The $10^{th}$ harmonic (2000 MHz) is an undesired harmonic so the gain for the $10^{th}$ harmonic is much lower than for the $4^{th}$ and $9^{th}$ harmonics (e.g., 35-45 dB rejection). The noise figure is 2-4 dB depending on the received harmonics, as higher harmonics have worse noise aliasing from their images. For 2-channel receptions, a worst case 80 MHz blocker occurs when the signal frequencies are 2100 MHz and 2190 MHz, while the blocker is at 2270 MHz. Under this setup, the LO frequency is tuned to 153.5 MHz to achieve a greatest amount of attenuation of the blocker, and both signals are down-converted from the 14th harmonic. At the baseband output, the blocker resides at 121 MHz, while the output bandwidth is 49 MHz in order to pass both signals. The gain and noise figure versus blocker power is plotted in FIG. 11B. In fact, the blocker is also down-converted to 32.5 MHz at the 15th harmonic of the LO, which is within the baseband output bandwidth. The measurement result shows that the receiver could tolerate both large blockers that are close to baseband as well as harmonic blockers. With the digitized 32 TIA outputs, the harmonic rejection calibration can also be applied, which results in an improvement in the harmonic rejection ratio from 50 dB to >80 dB for all the harmonics within the capturing range. The calibration results reduces the effects of random or systematic mismatches in the 32-phase LO, mixers, baseband TIAs, and the sampling ADCs.

Table 1 provides a comparison between the harmonic selective FBC receiver described herein and other DS and wideband receivers. Compared to existing solutions, the harmonic selective FBC receiver architecture achieves superior sensitivity and dynamic range, uses narrower LO tuning range to cover the wide bandwidth, and leads to significant power savings for wireless FBC applications.

TABLE 1

| Topology | Direct Sampling FBC | Wideband SDR | Harmonic Selective FBC |
| --- | --- | --- | --- |
| CMOS Technology | 28 nm | 65 nm | 28 nm |
| Capturing Band [MHz] | 0-2500 | 0-3200 | 700-2500 |
| Number of Phases | 8 | 8 | 32 |
| NF [dB] | 30 (w/o extra LNA) | 3 | 2~4 |
| Blocker Dynamic Range [dB] | 86.1 | 95.8 | 95.8 |
| LO Tuning Range | 0% | 200% | 30% |
| HR Ratio [dB] | 54.7 | 52 | >80 (with calibration) |
| Power [mW] | 150 | 36 | 25 |
| Active Area | 0.45 | 5.0 | 3.0 |

Figure 12:
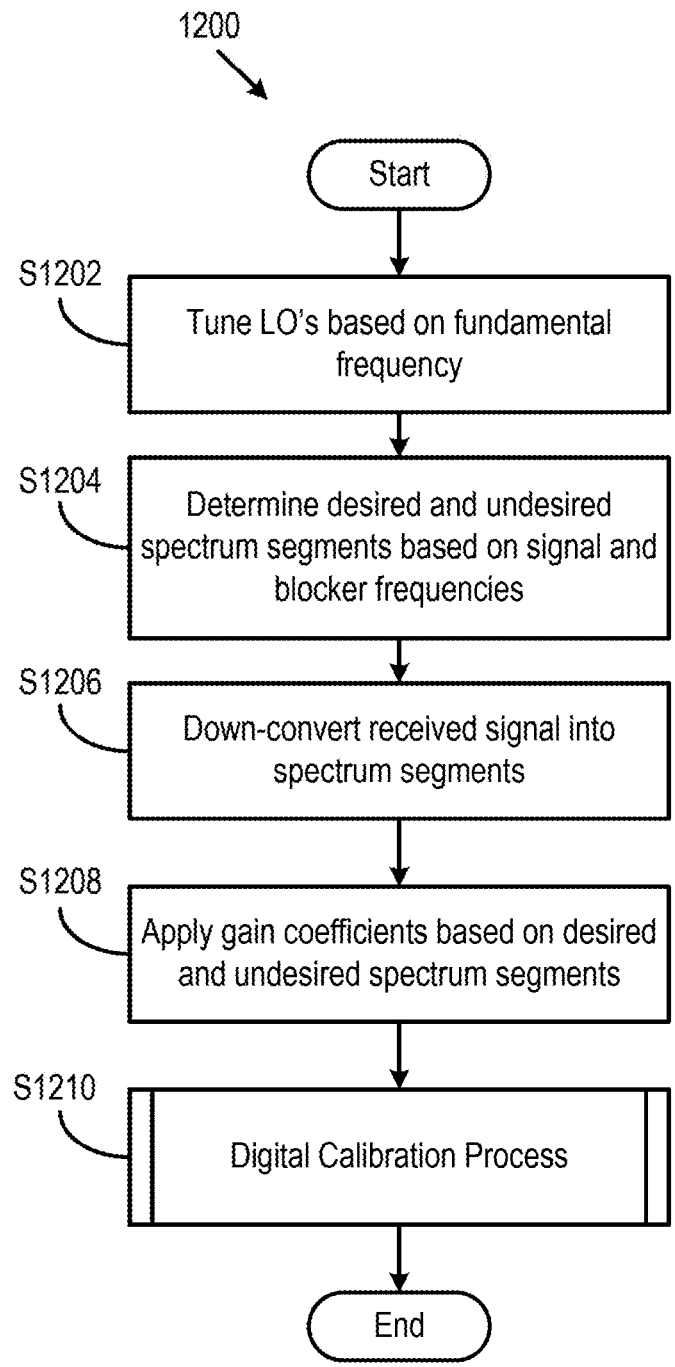
FIG. 12 is an exemplary flowchart of a process for selecting and processing one or more spectrum segments of a harmonic selective FBC receiver.

FIG. 12 is an exemplary flowchart of a process 1200 for selecting and processing one or more spectrum segments of a harmonic selective FBC receiver. The process 1200 is described with respect to the receiver front end 800, but it can be understood that one or more steps of the process 1200 can be applied to harmonic selective FBC receivers having structures that differ from the receiver front end 800.

At step S1202, the non-overlapping LO signals 818 for the multi-phase mixers 816 and 820 are tuned so that the baseband frequencies of the desired received signal are less than a predetermined threshold. In addition, the LO signals 818 can also be tuned so that a baseband blocker frequency corresponds to a low-pass filter frequency, such as a frequency within a filtering band of an anti-aliasing filter. In some wireless applications, the receiver receives a limited number of signals in predetermined frequency bands so the baseband processing module 508 can tune the LO frequencies according to the frequency of the signals such that after down-conversion, the baseband frequencies of the received signal are reduced or minimized, which can also further reduce a sampling speed of the ADCs. Also, in the presence of out-of-band blockers, the LO frequency can be tuned such that the blockers are attenuated by low-pass filters in the baseband paths.

At step S1204, the processing circuitry of the baseband processing block 808 determines the desired and undesired spectrum segments based on frequency bands associated with the received signal and blockers. In some implementations, the processing circuitry determines the desired spectrum segments to be amplified based on frequency bands associated with the received signal. For example, the frequency bands of the received signal can be determined based on frequency channels associated with a wireless signal protocol of the received signals that can include LTE, WLAN, GSM, GPS, BT, or any other type of wireless signal protocol that is known. The processing circuitry can also determine the undesired spectrum segments to be rejected based on frequency locations of blockers or any other type of interference signal.

At step S1206, a received signal is down-converted into one or more spectrum segments at the multi-phase mixers 816 and 820 in the main and auxiliary down-conversion paths 804 and 806 of the receiver front end 800. Each of the outputs of the multi-phase mixer 816 and 820 contains down-converted spectrums corresponding to the $\pm 1^{st}$ to the $\pm(M/2-1)^{th}$ harmonics of the fundamental LO frequency. For the $n^{th}$ baseband outputs of the multi-phase mixers 816 and 820, the received signals around the k-th harmonic, e.g. $k*F_{LO}$, have a phase shift of $2\pi kn/M$.

At step S1208, transconductance (GM) weighting coefficients are applied to the desired and undesired spectrum segments so that the desired spectrum segments are amplified and the undesired spectrum segments are rejected. The baseband processing module 808 determines and controls the weighting coefficients for each of the received spectrum segments for the $\pm 1^{st}$ to the $\pm(M/2-1)^{th}$ harmonics of the fundamental LO frequency.

The transconductance ($G_M$) stage associated with each of the harmonic selective TIAs 824 and 826 in the down-conversion paths 804 and 806 takes the outputs of the mixers 816 and 820, and combines them with sinusoidal weighting coefficients determined by the processing circuitry of the baseband processing module 808 based on whether the TIAs 824 and/or 826 are associated with a desired or undesired spectrum segment. For example, for the main down-conversion path 804, if the $k^{th}$ harmonic is associated with a desired spectrum segment, the coefficient of the $n^{th}$ mixer output is $_{[n]}=\cos(2\pi kn/M)$. In the case of multiple harmonics being received, the transconductance ($G_M$) weighting coefficient for the corresponding TIA 824 in the main down-conversion path 804 corresponds to a combination of the selected harmonics as described previously by Eq. 4.

With this approach, the effective transconductance value ($G_{m,EFF}$) for the TIAs 824 in the main down-conversion path 804 is large for the desired harmonics and zero for the undesired harmonics. Therefore, only desired harmonics are amplified by the TIAs 824. In some implementations, a DC offset is introduced to the transconductance ($G_M$) units for the TIAs to maintain positive values for the transconductance ($G_M$) weighting coefficients, which may result in the $0^{th}$ harmonic not being rejected as well as increased power consumption. However, the $0^{th}$ harmonic can be rejected if desired with filtering by DC block capacitors at the RF input 805. The increased power consumption may result in higher noise from the transconductance ($G_M$) stages of the TIAs. However, as the number of received desired harmonics increases, the amount of DC offset applied to maintain positive values for the transconductance ($G_M$) weighting coefficients decreases, which reduces the power consumption. In the case where all harmonics in the received spectrum are associated with desired spectrum segments, no harmonic rejection is performed and the harmonic selective TIAs 824 becomes single-input single-output TIAs. By applying the determined transconductance ($G_M$) weighting coefficients to the harmonic selective TIAs in the main down-conversion path 804 associated with the desired spectrum segments and setting the weighting coefficients to zero for the undesired spectrum segments, the main down-conversion path 804 may not saturated by harmonic blockers.

For the auxiliary down-conversion path 806, the transconductance ($G_M$) weighting coefficients for the harmonic selective TIAs 826 vary slightly from the transconductance ($G_M$) weighting coefficients for the main down-conversion path 804. If the values for the transconductance ($G_M$) weighting coefficients in the main down-conversion path 804 are adopted for the TIAs 826 in the auxiliary down-conversion path 806, an input impedance seen by the undesired harmonic blockers can be large, which can result in large voltage swings at the output of the transconductance cell 822 and the input of the TIAs 826. Therefore, instead of completely nulling the effective $G_M$ for the undesired harmonics, an effective $G_M$ value is determined for the undesired harmonics, $G_{m,EFF,off}$, that is less than the effective $G_M$ value for the desired harmonics $G_{m,EFF,on}$, such that the voltage gain across the transconductance cell 822 is less than 10 dB. If $k_{d,i}$ and $k_{u,i}$ are sets of desired and undesired harmonics for the TIAs 826, respectively, then the $G_M$ values for the TIAs 826 in the auxiliary down-conversion path 806 can be described by Eq. 5.

At step S1210, a digital calibration process is performed on a digitized output of the baseband processing block 808 to reduce the effects of signal leakage between spectrum segments due to phase and/or amplitude mismatches that may occur during LO down-conversion. Due to the phase and amplitude mismatches in the LO signals 818, a harmonic rejection ratio at the analog baseband outputs may be limited to 40~50 dB. Therefore, although the harmonic blockers may not saturate the receiver, the received signal can still become corrupted if the blockers fall on top of the desired signals after down-conversion is performed. In one example, the harmonic rejection ratio can be further improved by performing the digital calibration process at digital calibration block 840. Details regarding the digital calibration process are discussed further herein.

Figure 13:
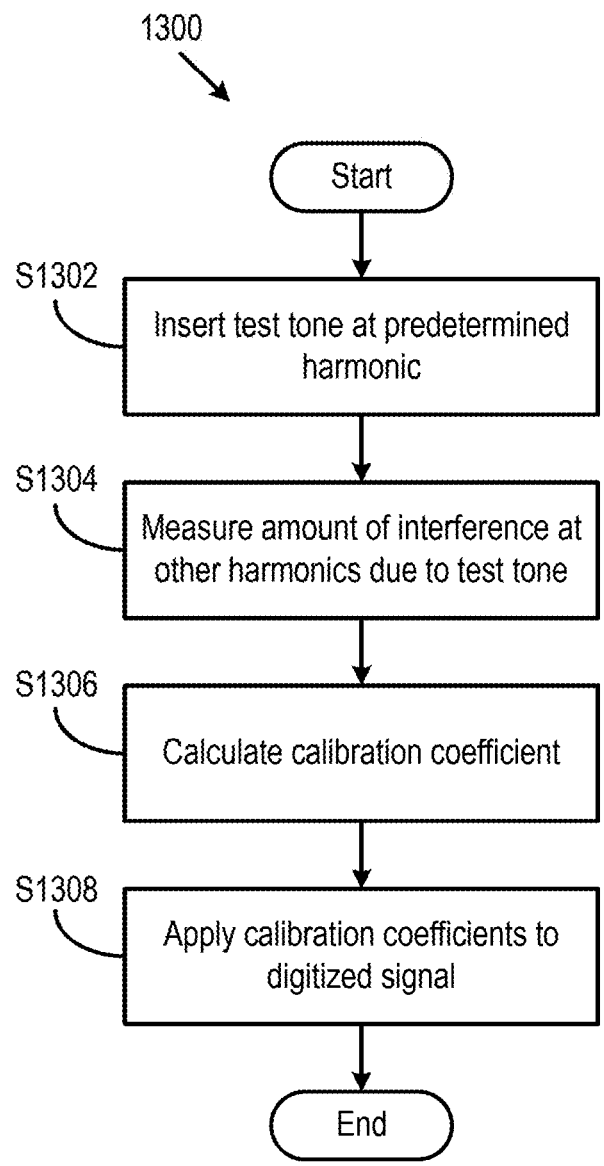
FIG. 13 is an exemplary flowchart of a process for performing calibration of a harmonic selective FBC receiver.

FIG. 13 is an exemplary flowchart of a process 1300 for performing calibration of a harmonic selective FBC receiver. In some implementations, the process 1300 is an implementation of the digital calibration process that is performed at step S1210 of the process 1200.

At step S1302, a test tone is inserted at a harmonic that correspond to one of the down-converted spectrum segments. For example, the $4^{th}$ harmonic of the received signal may correspond to a blocker signal frequency, which is rejected based on the transconductance values (GM) applied to the TIAs 824 and 826, but may still cause signal leakage into other desired spectrum segments associated with other harmonics. The digital calibration block 840 can insert the test tone at the $4^{th}$ harmonic in order to determine how much of the signal content at the $4^{th}$ harmonic leaks into the other harmonics of the received signal spectrum.

At step S1304, the amount of interference at other harmonics of the down-converted signal spectrum due to the inserted test tone is measured. If the test tone is inserted at the $i^{th}$ harmonic, then the output power is measured at the $i^{th}$ and $j^{th}$ harmonic outputs, $(i,)$ and $(i,)$. The $j^{th}$ harmonic outputs can correspond to the power outputs at each harmonic other than the $i^{th}$ harmonic where the test tone is inserted. For example, if the test tone is inserted at the $4^{th}$ harmonic, then the output power is measured at the harmonics other than the $4^{th}$ harmonic caused by the test tone inserted at the $4^{th}$ harmonic and compared to the output power at the $4^{th}$ harmonic. At step S1306, the calibration coefficient is for the test tone inserted $i^{th}$ harmonic, which is described by Eq. 5.

In some implementations, steps S1302, S1304, and S1306 of the process 1300 are performed for each down-converted harmonic in the received signal spectrum so that the effects of signal leakage from each of the spectrum segments into the other down-converted spectrum segments can be measured and removed by the determined calibration coefficients. At step S1308, the calculated calibration coefficients are applied to the digitalized signal by the digital calibration block 840 effects of signal leakage between spectrum segments due to phase and/or amplitude mismatches that may occur during LO down-conversion.

Those of skill in the art would appreciate that the various illustrative blocks, modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components. Additionally, an implementation may be performed on modules or hardware not identical to those described. Accordingly, other implementations are within the scope that may be claimed.

The invention claimed is:

1. A device comprising:
   circuitry configured to
   down-convert a received signal into a plurality of spectrum segments,
   determine one or more first local oscillator (LO) harmonics that correspond to one or more first spectrum segments of the plurality of spectrum segments of the down-converted received signal based on characteristics of the received signal,
   amplify the one or more first LO harmonics of the received signal by applying one or more first transimpedance coefficients to one or more first harmonic selective transimpedance amplifiers (TIAs) of a plurality of harmonic selective TIAs corresponding to the one or more first spectrum segments, and
   calibrate digitized outputs of the plurality of harmonic selective TIAs based on an amount of signal leakage between the plurality of spectrum segments of the down-converted received signal,
   wherein a number of the one or more first spectrum segments corresponds to half of a number of non-overlapping LO phases.

2. The device of claim 1, wherein the circuitry is further configured to tune a LO frequency for a multi-phase mixer generating the down-converted received signal to a fundamental frequency resulting in a baseband frequency of the received signal that is less than a predetermined threshold.

3. The device of claim 1, wherein the circuitry is further configured to tune a LO frequency for a multi-phase mixer generating the down-converted received signal to a fundamental frequency resulting in a baseband blocker frequency that corresponds to a low-pass filter frequency.

4. The device of claim 1, wherein the circuitry is further configured to determine one or more second LO harmonics that correspond to one or more second spectrum segments of the plurality of spectrum segments that correspond to one or more blocker signal frequencies.

5. The device of claim 4, wherein the circuitry is further configured to reject the one or more second LO harmonics of the received signal by applying one or more second transimpedance coefficients to one or more second harmonic selective TIAs corresponding to the one or more second spectrum segments.

6. The device of claim 5, wherein the circuitry is further configured to determine the one or more first or second transimpedance gain coefficients for each of the plurality of harmonic selective TIAs based on at least one frequency band of the received signal and the one or more blocker signal frequencies.

7. The device of claim 6, wherein the plurality of harmonic selective TIAs are configured to convert a current received from a multi-phase LO mixer to a voltage based on the one or more first or second transimpedance gain coefficients for each of the plurality of harmonic selective TIAs.

8. The device of claim 1, wherein the circuitry further includes a first receiver path in parallel with a second receiver path wherein
   the first receiver path includes a first set of harmonic selective TIAs having a corresponding first effective transimpedance gain coefficient for each of the plurality of spectrum segments; and
   the second receiver path includes a second set of harmonic selective TIAs having a corresponding second effective transimpedance gain coefficient for each of the plurality of spectrum segments.

9. The device of claim 8, wherein the first effective transimpedance gain coefficient and the second effective transimpedance gain coefficient include a summation of the one or more first transimpedance gain coefficients associated with the one or more first spectrum segments and one or more second transimpedance gain coefficients associated with one or more second spectrum segments that correspond to one or more blocker signal frequencies.

10. The device of claim 9, wherein the circuitry is further configured to determine that the one or more second transimpedance gain coefficients associated with the first set of harmonic selective TIAs are equal to zero.

11. The device of claim 9, wherein the circuitry is further configured to determine that the one or more first transimpedance gain coefficients associated with the first set or the second set of harmonic selective TIAs are equal to $g_-(m[n])=\cos(2\pi kn/M)$, where k represents a harmonic number of the LO output, n represents a LO number, and M represents a number of LO phases.

12. The device of claim 11, wherein the circuitry is further configured to insert a DC offset into the one or more first transimpedance gain coefficients associated with the first set or the second set of harmonic selective TIAs resulting in positive values for the one or more first transimpedance gain coefficients.

13. The device of claim 11, wherein the circuitry is further configured to determine that the one or more second transimpedance gain coefficients associated with the second set of harmonic selective TIAs are equal to $g_-(m[n])=\cos(2\pi kn/M)$, and the one or more second transimpedance gain coefficients are less than the one or more first transimpedance gain coefficients.

14. The device of claim 13, wherein voltage gain across the first receiver path or the second receiver path due to the first effective transimpedance gain coefficient or the second effective transimpedance gain coefficient is less than 10 dB.

15. The device of claim 1, wherein the circuitry is further configured to reduce interference between one or more digitized spectrum segments by performing a digital spectrum calibration of the one or more digitized spectrum segments output from an analog-to-digital converter (ADC) that digitizes the plurality of spectrum segments of the down-converted received signal.

16. The device of claim 15, wherein the circuitry is further configured to insert a test tone corresponding to a spectrum segment at a predetermined harmonic location to determine an amount of interference between the one or more digitized spectrum segments.

17. The device of claim 16, wherein the circuitry is further configured to determine a calibration coefficient for the one or more digitized spectrum segments based on a ratio of a first amount of measured power output at one or more additional harmonic locations to a second amount of measured power output at the predetermined harmonic location in response to the test tone inserted at the predetermined harmonic location.

18. A method comprising:
tuning, at a device with circuitry, a first local oscillator (LO) of a plurality of non-overlapping LOs of a receiver to a fundamental frequency based on at least one frequency band of a received signal;
converting, via the circuitry, the received signal via the plurality of non-overlapping LOs into one or more spectrum segments that correspond to one or more harmonics of the fundamental frequency;
amplifying, via the circuitry, one or more first spectrum segments of the one or more spectrum segments that correspond to the at least one frequency band of the received signal, a number of the one or more first spectrum segments corresponding to half of a number of non-overlapping LO phases; and
calibrating, via the circuitry, one or more digitized spectrum segments based on an amount of signal leakage between the one or more spectrum segments of the down-converted received signal.

19. A receiver comprising:
circuitry configured to
tune a first local oscillator (LO) of a plurality of non-overlapping LOs of a receiver to a fundamental frequency based on at least one frequency band of a received signal,
convert the received signal via the plurality of non-overlapping LOs into one or more spectrum segments that correspond to one or more harmonics of the fundamental frequency, a number of the one or more first spectrum segments corresponding to half of a number of non-overlapping LO phases, and
amplify one or more first spectrum segments of the one or more spectrum segments that correspond to the at least one frequency band of the received signal.

* * * * *